United States Patent
Yoshinaga

(10) Patent No.: US 10,978,855 B2
(45) Date of Patent: Apr. 13, 2021

(54) QUANTUM CASCADE SEMICONDUCTOR LASER

(71) Applicant: SUMITOMO ELECTRIC INDUSTRIES, LTD., Osaka (JP)

(72) Inventor: Hiroyuki Yoshinaga, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 114 days.

(21) Appl. No.: 16/540,649

(22) Filed: Aug. 14, 2019

(65) Prior Publication Data
US 2020/0067282 A1 Feb. 27, 2020

(30) Foreign Application Priority Data
Aug. 24, 2018 (JP) .............................. JP2018-157675

(51) Int. Cl.
| | | |
|---|---|---|
| H01S 5/34 | (2006.01) | |
| H01S 5/227 | (2006.01) | |
| H01S 5/22 | (2006.01) | |
| H01S 5/183 | (2006.01) | |
| H01S 5/16 | (2006.01) | |

(52) U.S. Cl.
CPC ............ *H01S 5/3402* (2013.01); *H01S 5/168* (2013.01); *H01S 5/18377* (2013.01); *H01S 5/227* (2013.01); *H01S 5/2224* (2013.01); *H01S 5/2275* (2013.01)

(58) Field of Classification Search
CPC .... H01S 5/3402; H01S 5/168; H01S 5/18377; H01S 5/227; H01S 5/2275; H01S 5/2224
See application file for complete search history.

(56) References Cited

U.S. PATENT DOCUMENTS

| | | | |
|---|---|---|---|
| 2013/0028280 A1* | 1/2013 | Hongo ................... | B82Y 20/00 372/44.01 |
| 2018/0366910 A1* | 12/2018 | Yoshinaga ............ | H01S 5/0285 |
| 2018/0366911 A1* | 12/2018 | Yoshinaga .............. | H01S 5/227 |
| 2018/0366912 A1* | 12/2018 | Hashimoto ......... | H01S 5/02326 |
| 2018/0375295 A1* | 12/2018 | Hashimoto ........... | H01S 5/0203 |

OTHER PUBLICATIONS

Razeghi, Manijeh, High-Performance InP-Based Mid-IR Quantum Cascade Lasers, *IEEE Journal of Selected Topics in Quantum Electronics*, vol. 15, Issue 3, pp. 941-951, Jun. 2009.

* cited by examiner

*Primary Examiner* — Yuanda Zhang
(74) *Attorney, Agent, or Firm* — Smith, Gambrell & Russell, LLP.

(57) ABSTRACT

A quantum cascade semiconductor laser includes a laser structure having a first area including an end face, a second area, and a third area; a metal layer provided on a major surface in the third area; a separation area provided on the major surface; and a reflector provided on the laser structure. The reflector includes a dielectric film and a metal reflecting film provided on the end face and the separation area. The separation area has a first portion, a second portion, and a third portion. The metal layer has an edge separated from the end face in the third area. The contact layer has an edge separated from the end face in the third area. The first portion projects more than the second portion over the semiconductor mesa. The third portion projects more than the second portion over the semiconductor mesa.

6 Claims, 14 Drawing Sheets

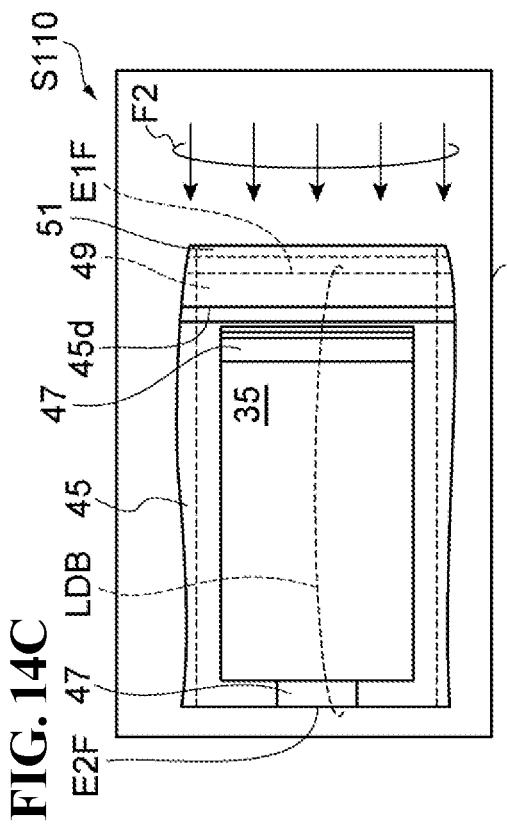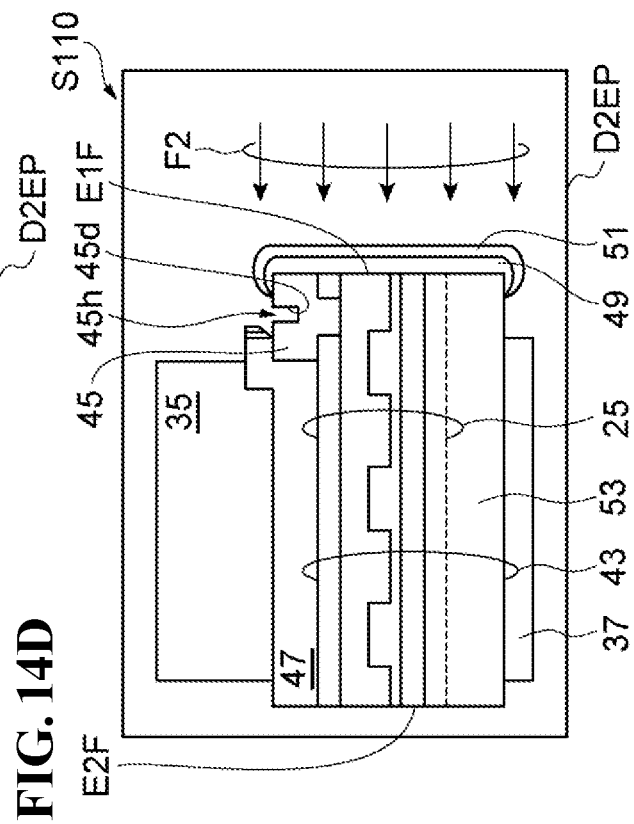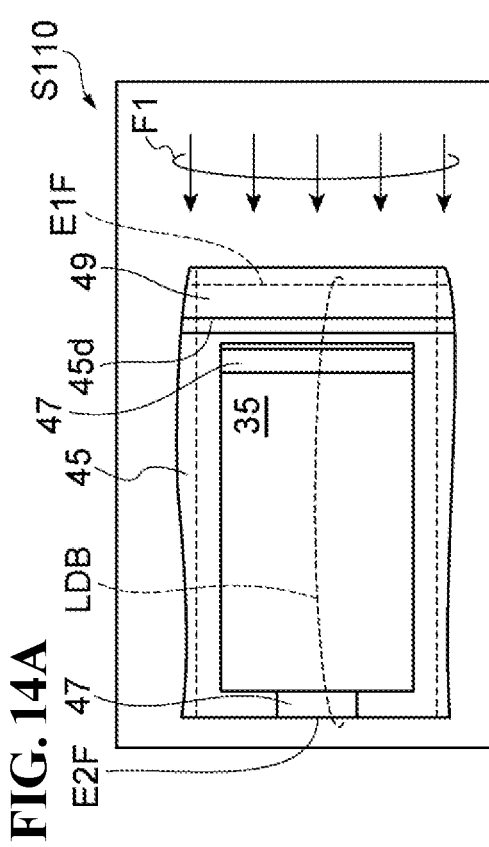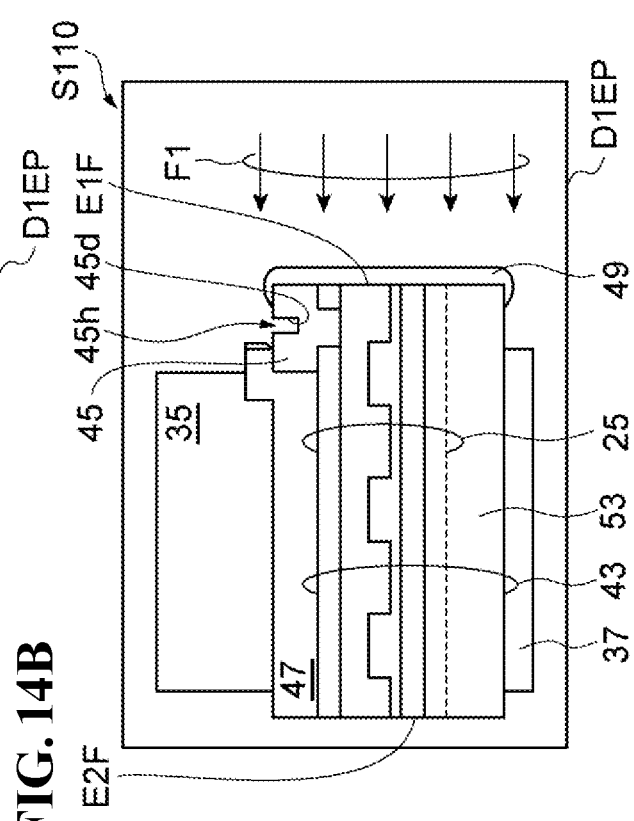

QUANTUM CASCADE SEMICONDUCTOR LASER

BACKGROUND OF THE INVENTION

1. Field of the Invention

The present disclosure relates to a quantum cascade semiconductor laser.

2. Description of the Related Art

Manijeh Razeghi, "High-Performance InP-Based Mid-IR Quantum Cascade Lasers," IEEE JOURNAL OF SELECTED TOPICS IN QUANTUM ELECTRONICS, Vol. 15, Issue 3, PP. 941-951, MAY-JUNE 2009 discloses a quantum cascade semiconductor laser.

SUMMARY OF THE INVENTION

A quantum cascade semiconductor laser has an end face reached by multiple conductive semiconductor layers for a semiconductor laser, and is provided with a reflector on the end face. The reflector includes a metal film, and the metal film directly provided over the end face causes a short circuit of the conductive semiconductor layers which reach the end face. In order to avoid a short circuit, before the metal film is grown, a multilayer film for the reflector may be formed on the end face of a laser bar by depositing a dielectric film on the end face. The multilayer film has a dielectric film and a metal film between the end face and the reflector, and the underlying dielectric film prevents the conductive semiconductor layer on the end face from reaching through the metal film to cause a short circuit. According to the knowledge of the inventor, some quantum cascade semiconductor lasers including a multilayer film showing a leakage current, and during an operation showing a leakage current are discovered. According to the study of the inventor, the leakage current is caused by a short circuit of a quantum cascade semiconductor laser including the dielectric film and the metal film which cover the end face.

It is an object of an aspect of the present disclosure to provide a quantum cascade semiconductor laser having a structure capable of preventing a metal film on the end face from causing a short circuit.

A quantum cascade semiconductor laser according to an aspect of the present disclosure includes: a laser structure having a first area including an end face, a second area, and a third area; a metal layer provided on a major surface of the laser structure in the third area; a separation area provided on the major surface of the laser structure; and a reflector provided on the laser structure. The reflector includes a dielectric film and a metal reflecting film provided on the end face and the separation area, the first area, the second area, and the third area of the laser structure are sequentially disposed in a direction of a first axis, the separation area has a first portion, a second portion, and a third portion respectively provided on major surfaces of the first area, the second area, and the third area of the laser structure, the metal layer has an edge separated from the end face in the third area, the laser structure includes a semiconductor mesa including a contact layer and a core layer, an embedding area in which the semiconductor mesa is embedded, and a substrate on which the embedding area and the semiconductor mesa are mounted, the contact layer has an edge separated from the end face in the third area, the first portion of the separation area projects more than the second portion of the separation area over the semiconductor mesa, and the third portion of the separation area projects more than the second portion of the separation area over the semiconductor mesa.

The above-described object and another object, characteristics, and advantage of the present disclosure will be easily apparent from the following detailed description of preferred embodiments of the present disclosure with reference to the accompanying drawings.

BRIEF DESCRIPTION OF THE DRAWINGS

FIG. 11C illustrates a cross-section taken along line XIc-XIc illustrated in

FIG. 11B.

FIG. 13B illustrates a cross-section taken along line XIIIb-XIIIb illustrated in

FIG. 13A.

FIGS. 14A, 14B, 14C, and 14D are drawings schematically illustrating the steps in the method of producing the quantum cascade semiconductor laser according to the embodiment.

DESCRIPTION OF THE PREFERRED EMBODIMENTS

Figure 1:
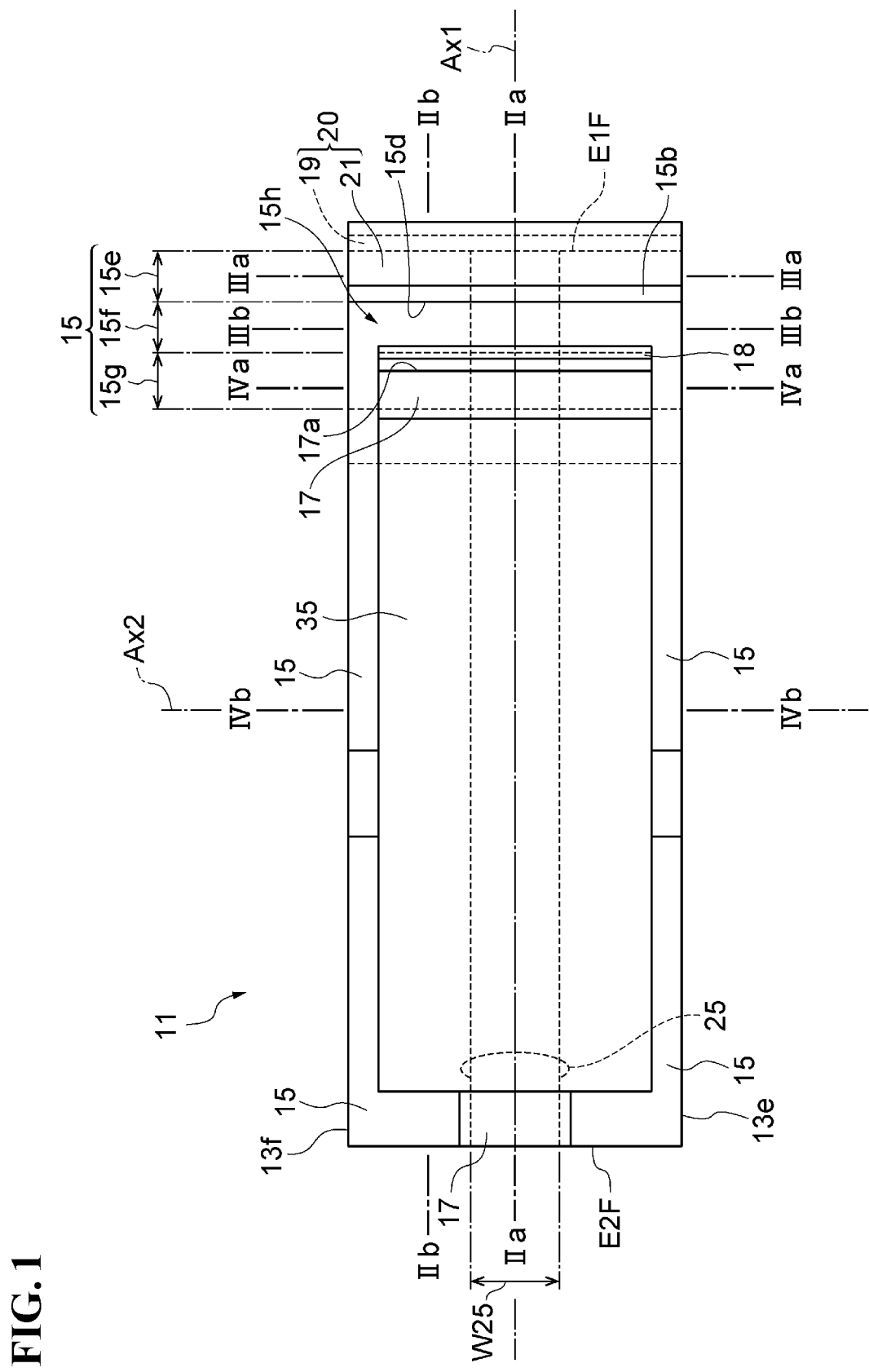
FIG. 1 is a plan view schematically illustrating a quantum cascade semiconductor laser according to an embodiment.

Some specific examples will be described.

A quantum cascade semiconductor laser according to a specific example includes: (a) a laser structure a first area including an end face, a second area, and a third area; (b) a metal layer provided over the major surface of the third area of the laser structure; (c) a separation area provided over the major surface of the laser structure; and (d) a reflector provided over the laser structure. The reflector includes a dielectric film and a metal reflecting film provided on the end face and the separation area, the first area, the second area, and the third area of the laser structure are sequentially disposed in a direction of a first axis, the separation area has a first portion, a second portion, and a third portion respectively provided on major surfaces of the first area, the second area, and the third area of the laser structure, the metal layer has an edge separated from the end face in the third area, the laser structure includes a semiconductor mesa including a contact layer and a core layer, an embedding area in which the semiconductor mesa is embedded, and a substrate on which the embedding area and the semiconductor mesa are mounted, the contact layer has an edge separated from the end face in the third area, the first portion of the separation area projects more than the second portion of the separation area over the semiconductor mesa, and the third portion of the separation area projects more than the second portion of the separation area over the semiconductor mesa.

In the quantum cascade semiconductor laser, a contact layer in the semiconductor mesa has an edge separated from the end face of the laser structure over the third area of the laser structure, thus the current density in the semiconductor mesa is reduced in the vicinity of the end face. In the vicinity of the end face, the separation area projects more than the second portion in the first portion. The projection causes the metal reflecting film of the reflector to terminate on the first portion of the separation area. Specifically, the first portion of the separation area projects more than the second portion, and the projected portion can shield flux for forming the dielectric film and the metal reflecting film.

The first portion of the separation area may be assigned a thickness which can be determined independently from the thickness of the dielectric film and the thickness of the second portion of the separation area on the semiconductor mesa. The thickness enables a desired insulation performance between the metal reflecting film and the semiconductor mesa on the separation area. The metal layer terminates on the third area which projects more than the second portion of the laser structure, according to the edge of the contact layer.

The semiconductor mesa is lower than the semiconductor mesa of the third area on the semiconductor mesa of the first area and the second area by the thickness of the contact layer, and is lower than the embedding area of the first area and the second area. On the semiconductor mesa, the first portion of the separation area is lower than the first portion of the separation area on the embedding area by the thickness of the contact layer. On the semiconductor mesa, the second portion of the separation area is depressed relative to the first portion and the third portion. The depression forms two wall surfaces on the semiconductor mesa. These two wall surfaces are provided between the metal layer on the third area and the metal reflecting film of the first area. The depression allows the contact layer to terminate, and the first portion to project.

In the quantum cascade semiconductor laser according to the specific example, the laser structure further includes a fourth area, the first area, the second area, the third area, and the fourth area are sequentially disposed in the direction of the first axis, the separation area includes a covering layer provided on the major surface of the laser structure, the covering layer includes a first inorganic insulating layer, the covering layer has a stripe-shaped opening positioned over the semiconductor mesa in the major surface of the laser structure in the fourth area, and the metal layer is in contact with the fourth area through the stripe-shaped opening.

In the quantum cascade semiconductor laser, the first inorganic insulating layer is provided with the stripe-shaped opening separated from the end face, it is possible for the metal layer to come into contact with the contact layer provided over the third area and the fourth area through the stripe-shaped opening on the fourth area.

In the quantum cascade semiconductor laser according to the specific example, on the first area, the separation area includes a base layer extending in the direction of a second axis, crossing the direction of a first axis, and the covering layer is provided over the base layer.

In the quantum cascade semiconductor laser, the base layer makes it easy for the first portion of the separation area projects more than the second portion of the separation area in the first area.

In the quantum cascade semiconductor laser according to the specific example, the base layer further includes a second inorganic insulating layer which extends over the first area in the direction of the second axis crossing the direction of the first axis, the second inorganic insulating layer has an upper surface and an inner side surface which are in contact with a first inorganic insulating layer, the second inorganic insulating layer has an end face which is in contact with a dielectric film, the second inorganic insulating layer has a bottom surface which is in contact with the semiconductor mesa, and the first inorganic insulating layer has an end face and an upper surface which are in contact with the dielectric film in the first portion of the separation area.

In the quantum cascade semiconductor laser, the second inorganic insulating layer makes it easy for the first portion of the separation area to have a thick insulator in the first area.

In the quantum cascade semiconductor laser according to the specific example, the base layer includes a material different from the material of the first inorganic insulating layer.

In the quantum cascade semiconductor laser, the base layer may be assigned a material different from the material of the first inorganic insulating layer.

In the quantum cascade semiconductor laser according to the specific example, the base layer includes substantially the same material as that of the first inorganic insulating layer.

In the quantum cascade semiconductor laser, the base layer includes substantially the same material as that of the first inorganic insulating layer.

The knowledge of the disclosure may be easily understood by taking the detailed description in the following into consideration with reference to the accompanying drawings illustrated. Subsequently, the embodiment of the quantum cascade semiconductor laser will be described with reference to the accompanying drawings. The same portion is labeled with the same symbol when possible.

Figure 2A:
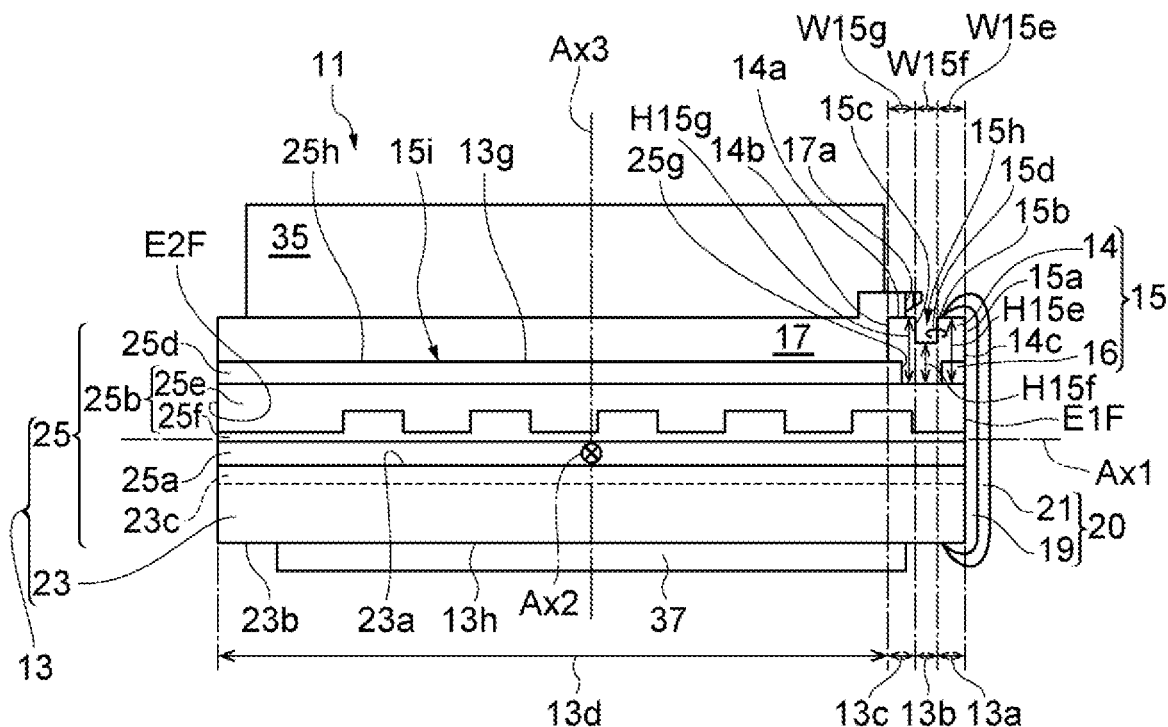
FIGS. 2A and 2B are cross-sectional views schematically illustrating the quantum cascade semiconductor laser according to the embodiment.

FIG. 1 is a plan view schematically illustrating a quantum cascade semiconductor laser according to this embodiment. FIG. 2A is a cross-sectional view taken along IIa-IIa line of FIG. 1, and FIG. 2B is a cross-sectional view taken along IIb-IIb line of FIG. 1.

Figure 2B:
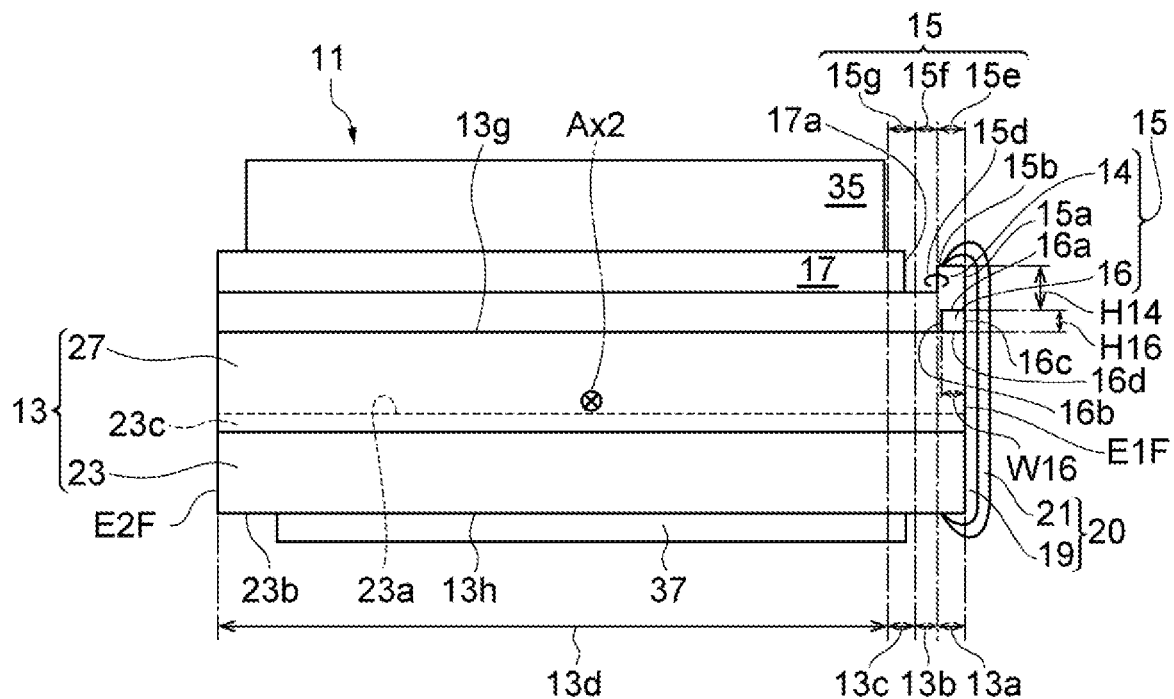

Referring to FIGS. 1, 2A and 2B, a quantum cascade semiconductor laser 11 is illustrated. The quantum cascade semiconductor laser 11 includes a laser structure 13, a separation area 15, a metal layer 17, and a reflector 20.

The laser structure 13 includes a substrate 23, a semiconductor mesa 25, and an embedding area 27. The laser structure 13 has a first area 13a, a second area 13b, and a third area 13c. The first area 13a, the second area 13b, and the third area 13c are sequentially disposed in the direction of a first axis Ax1. The laser structure 13 includes a first end face E1F and a second end face E2F, and the first area 13a includes the first end face E1F. The first end face E1F is on the opposite side to the second end face E2F. The laser structure 13 has a major surface 13g and a back surface 13h, and the major surface 13g is on the opposite side to the back surface 13h. The embedding area 27 embeds the semiconductor mesa 25. The embedding area 27 includes an unintentionally doped and/or semi-insulating III-V compound semiconductor.

The substrate 23 has the major surface 23a, which mounts the semiconductor mesa 25 and the embedding area 27. The semiconductor mesa 25 includes a core layer 25a and a contact layer 25d. The contact layer 25d has an edge 25g separated from the first end face E1F in a third area 13c. In this embodiment, the semiconductor mesa 25 includes a ridged portion of the substrate 23. The ridged portion includes a lower semiconductor area 23c.

The separation area 15 is provided over the major surface 13g of the laser structure 13. The separation area 15 has a first portion 15e, a second portion 15f, and a third portion 15g. The first portion 15e, the second portion 15f, and the third portion 15g are provided over the major surfaces of the first area 13a, the second area 13b, and the third area 13c of the laser structure 13, respectively.

On the semiconductor mesa 25, the first portion 15e of the separation area 15 projects more than the second portion 15f of the separation area 15. On the semiconductor mesa 25, the third portion 15g of the separation area 15 projects more than the second portion 15f of the separation area 15.

The reflector 20 is provided on the first end face E1F and the separation area 15, and includes a dielectric film 19 and a metal reflecting film 21. The dielectric film 19 is provided on the first end face E1F and the separation area 15, the metal reflecting film 21 is provided on the first end face E1F and the separation area 15, and extends on the dielectric film 19.

In the quantum cascade semiconductor laser 11, the contact layer 25d of the semiconductor mesa 25 has the edge 25g separated from the first end face E1F of the laser structure 13 over the third area 13c of the laser structure 13. Separation of the edge 25g from the first end face E1F reduces the density of the current which flows through the inside of the semiconductor mesa 25 in the vicinity of the first end face E1F.

The separation area 15 has an electrical conductivity lower than the electrical conductivity of the semiconductor mesa 25 or the substrate 23. In other words, the separation area 15 exhibits a resistivity higher than the resistivity of the semiconductor mesa 25. The separation area 15 may be an inorganic insulating film, such as a silicon-based inorganic insulator.

Referring to FIGS. 2A and 2B, the first portion of the separation area assigns the separation area 15 to a thickness which can be determined independently from the thickness of the dielectric film 19 and the thickness of the second portion 15f of the separation area 15 on the semiconductor mesa 25. The thickness enables a desired insulation performance between the metal reflecting film 21 and the semiconductor mesa 25 on the separation area 15.

Specifically, the separation area 15 is provided over the first area 13a, and has an end face 15a. The end face 15a and the first end face E1F extend along a reference plane crossing the first axis Ax1. The dielectric film 19 and the metal reflecting film 21 reach an upper face 15b of the separation area 15 through the first end face E1F and the end face 15a of the separation area 15. In the vicinity of the first end face E1F, the separation area 15 projects more than the second portion 15f in the first portion 15e. Due to the projection, the metal reflecting film 21 of the reflector 20 is terminated by the first portion 15e of separation area 15. The termination provides reliable insulation between the metal reflecting film 21 and the metal layer 17 on the semiconductor mesa 25. Specifically, the first portion 15e of the separation area 15 projects more than the second portion 15f, and due to the projected portion, when the dielectric film 19 and the metal reflecting film 21 are formed, the second portion 15f is shielded from the flux for film formation. The metal reflecting film 21 originating from the flux does not adhere to the second portion 15f.

The metal layer 17 is provided over the third area 13c of the laser structure 13. The metal layer 17 has an edge 17a separated from the first end face E1F in the third area 13c. The metal layer 17 terminates over the third area 13c which projects more than the second portion 15f of the laser structure 13. The projection corresponds to the edge 25g of the contact layer 25d. In this embodiment, the flux (deposition 18) when the dielectric film 19 and the metal reflecting film 21 are formed may adhere to the edge 17a of the metal layer 17.

The semiconductor mesa 25 has an upper face 25h, which is lower than the third area 13c in the first area 13a and the second area 13b by the thickness of the contact layer 25d, and is lower than the embedding area 27 of the first area 13a and the second area 13b in this embodiment. The second portion 15f of the separation area 15 is depressed relative to the first portion 15e and the third portion 15g over the semiconductor mesa 25. The depression forms two wall surfaces on the semiconductor mesa 25. These two wall surfaces are provided between the metal layer 17 on the third area 13c and the metal reflecting film 21 of the first area 13a over the semiconductor mesa 25.

In this embodiment, the semiconductor mesa 25 includes an upper semiconductor layer 25b in addition to the core layer 25a and the contact layer 25d, and further includes the lower semiconductor area 23c as necessary. The semiconductor mesa 25 extends in the direction of the first axis Ax1. The core layer 25a is provided between the upper semiconductor layer 25b and the lower semiconductor areas 23c. The core layer 25a, the upper semiconductor layer 25b, the lower semiconductor area 23c, and the contact layer 25d are arranged in the direction of a third axis Ax3 crossing the first axis Ax1 and the second axis Ax2. The arrangement and the embedding area 27 are provided over the major surface 23a of the substrate 23. The upper semiconductor layer 25b includes an upper cladding layer 25e and a grating layer 25f, and the lower semiconductor area 23c may include a lower cladding layer. The upper semiconductor layer 25b, the core layer 25a, and the lower semiconductor area 23c reach the first end face E1F. As already described, the contact layer 25d is separated from the first end face E1F.

The metal layer 17 is provided over the third area 13c and a fourth area 13d, and is separated from the laser structure 13 by the separation area 15 in the third area 13c of the laser structure 13.

In the quantum cascade semiconductor laser 11, the laser structure 13 further includes the fourth area 13d. The first area 13a, the second area 13b, the third area 13c, and the fourth area 13d are sequentially disposed in the direction of the first axis Ax1. In this embodiment, the fourth area 13d includes the second end face E2F. The fourth area 13d extends from the third area 13c to the second end face E2F.

The separation area 15 has a stripe-shaped opening 15i over the semiconductor mesa 25. The metal layer 17 is connected to the semiconductor mesa 25 through the stripe-shaped opening 15i in the major surface 13g of the fourth area 13d of the laser structure 13. In this embodiment, the stripe-shaped opening 15i is positioned over the semiconductor mesa 25. The metal layer 17 is in contact with the semiconductor mesa 25 in the fourth area 13d.

In this embodiment, the separation area 15 includes a covering layer 14 and a base layer 16. The covering layer 14 is provided over the major surface 13g of the laser structure 13, specifically provided over the first area 13a, the second area 13b, the third area 13c, and the fourth area 13d. The covering layer 14 covers the first area 13a, the second area 13b, and the third area 13c, and prevents an electrical conductor such as a semiconductor and metal from coming into contact with the semiconductor mesa 25. The base layer 16 is provided over the first area 13a, and is not provided over the second area 13b, the third area 13c, and the fourth area 13d. The covering layer 14 is provided with the stripe-shaped opening 15i by the base layer 16. The stripe-shaped opening 15i of the covering layer 14 is positioned over the major surface of the fourth area 13d of the laser structure 13. The metal layer 17 is in contact with the fourth area 13d through the stripe-shaped opening 15i of the covering layer 14. In this embodiment, in the fourth area 13d, the covering layer 14 covers the embedding area 27, and the stripe-shaped opening 15i is positioned over the semiconductor mesa 25.

The base layer 16 extends in the direction of the second axis Ax2 over the first area 13a. The covering layer 14 and the base layer 16 are stacked in the direction of the third axis Ax3 over the first area 13a. In the first area 13a, the base layer 16 makes it easy for the first portion 15e of the separation area 15 to project more than the second portion 15f of the separation area 15. The covering layer 14 extends from the second area 13b and the third area 13c to the base layer 16 over the first area 13a, and provides projection of the separation area 15.

The base layer 16 has an upper face 16a, an inner side face 16b, an outer side face 16c, and a bottom face 16d. The upper face 16a and the inner side face 16b both are in contact with the covering layer 14. The bottom face 16d is in contact with the first area 13a of the laser structure 13.

The covering layer 14 has an upper face 14a, an inner side face 14b, and an outer side face 14c. The upper face 14a and the outer side face 14c are in contact with the dielectric film 19 in the first portion 15e of the separation area 15. However, the dielectric film 19 and the metal reflecting film 21 are not formed over the inner side face 14b.

The outer side face 14c, the outer side face 16c, and the first end face E1F extends along the reference plane crossing the first axis Ax1. The separation area 15 causes the dielectric film 19 to extend along the reference plane up to a position separated from the upper end of the first end face E1F, and can provide a desired film thickness to the dielectric film 19 crossing the boundary between the separation area 15 and the laser structure 13.

The covering layer 14 includes the first inorganic insulating layer. The first inorganic insulating layer includes, for instance, a silicon-based inorganic insulator, such as a silicon oxide, a silicon nitride, and a silicon oxynitride, and includes a SiON film in this embodiment.

The base layer 16 may include the second inorganic insulating layer. The second inorganic insulating layer includes, for instance, a silicon-based inorganic insulator, such as a silicon oxide, a silicon nitride, and a silicon oxynitride, and includes a SiN film in this embodiment.

In the quantum cascade semiconductor laser 11, the base layer 16 may include a material different from the material of the covering layer 14. Alternatively, the base layer 16 may include substantially the same material as that of the covering layer 14.

The quantum cascade semiconductor laser 11 further includes a thick film electrode 35 (for instance, a plated electrode). The thick film electrode 35 is thicker than the metal layer 17. The thick film electrode 35 is provided on the metal layer 17 over the fourth area 13d, and is not provided on the metal layer 17 over the third area 13c. The thick film electrode 35 is separated from the edge 17a of the metal layer 17 in the direction of the first axis Ax1. Over the fourth area 13d, the thick film electrode 35 is in contact with the metal layer 17. In this embodiment, the thick film electrode 35 is positioned away from the upper edge of the second end face E2F.

The quantum cascade semiconductor laser 11 further includes a back surface metal layer 37 provided on the back surface of the laser structure 13. The back surface 13h of the laser structure 13 is provided by a back surface 23b of the substrate 23. In this embodiment, the back surface metal layer 37 is separated from the lower end of the first end face E1F and the second end face E2F. The back surface metal layer 37 is separated from the dielectric film 19 and the metal reflecting film 21 provided over the back surface 13h of the laser structure 13. When the quantum cascade semiconductor laser 11 is mounted on a submount using a solder material, the solder material couples the back surface metal layer 37 to the metal reflecting film 21.

In this embodiment, the separation area 15, specifically, the covering layer 14 is provided over Epi surface of the laser structure 13. The covering layer 14 serves as a passivation film.

Example of Materials of Quantum Cascade Semiconductor Laser 11

Core layer 25a: superlattice arranged to generate quantum cascade, GaInAs/AlInAs
Oscillation wavelength: 4 to 10 μm
Upper cladding layer 25e: n-type InP
Grating layer 25f: n-type InGaAs
Cladding layer (lower semiconductor area 23c): n-type InP
Contact layer 25d: n-type InGaAs
Substrate 23: n-type InP
Embedding area 27: Fe doped InP
Separation area: 15
Covering layer 14/base layer 16: SiN/SiON
Metal layer 17: Ti/Pt/Au
Back surface metal layer 37: AuGeNi/Au/Ti/Au
Thick film electrode 35: Au film
Dielectric film 19: alumina, SiON, SiN, SiO2
Metal reflecting film 21: Au
However, the reflector 20 is not limited to these two layers.

Figure 3A:
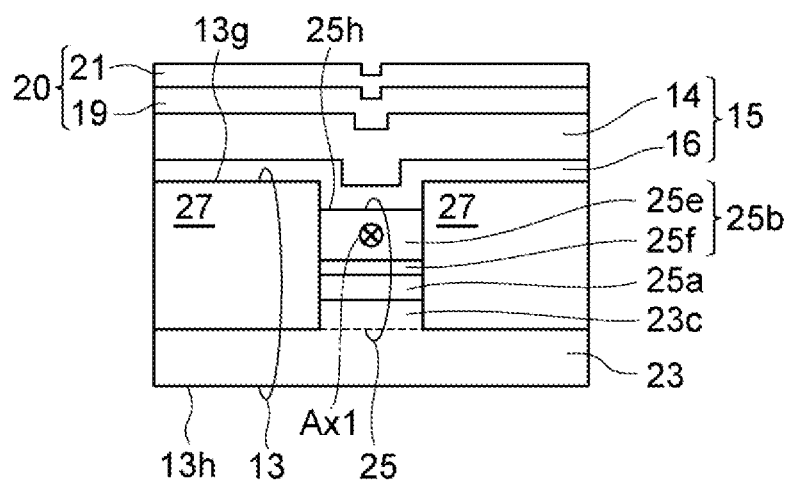
FIGS. 3A and 3B are cross-sectional views schematically illustrating the quantum cascade semiconductor laser according to the embodiment.
Figure 3B:
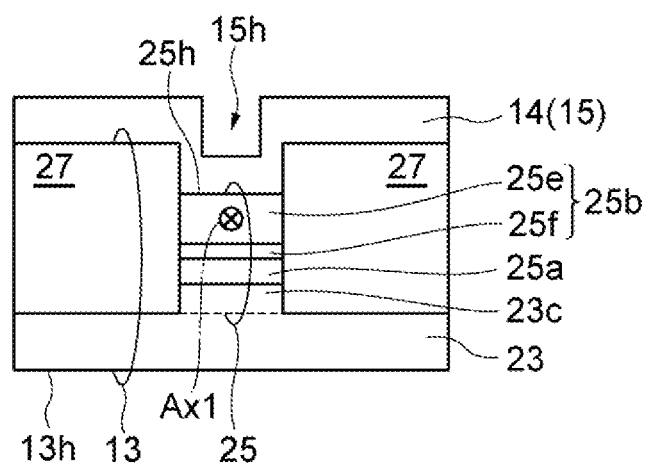
Figure 4A:
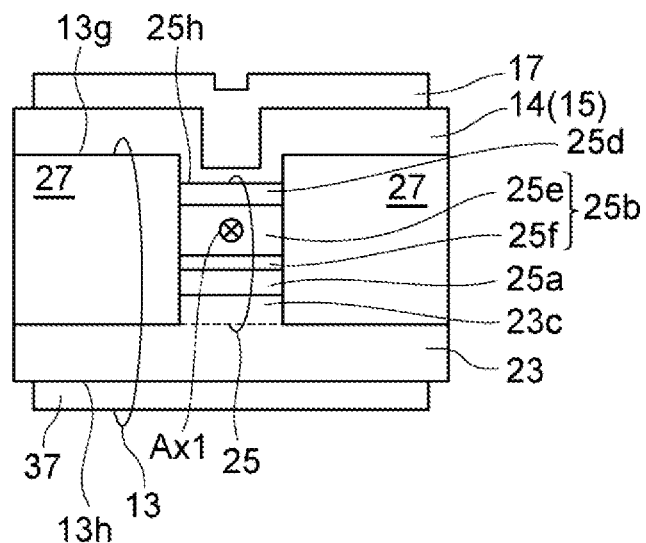
FIGS. 4A and 4B are cross-sectional views schematically illustrating the quantum cascade semiconductor laser according to the embodiment.
Figure 4B:
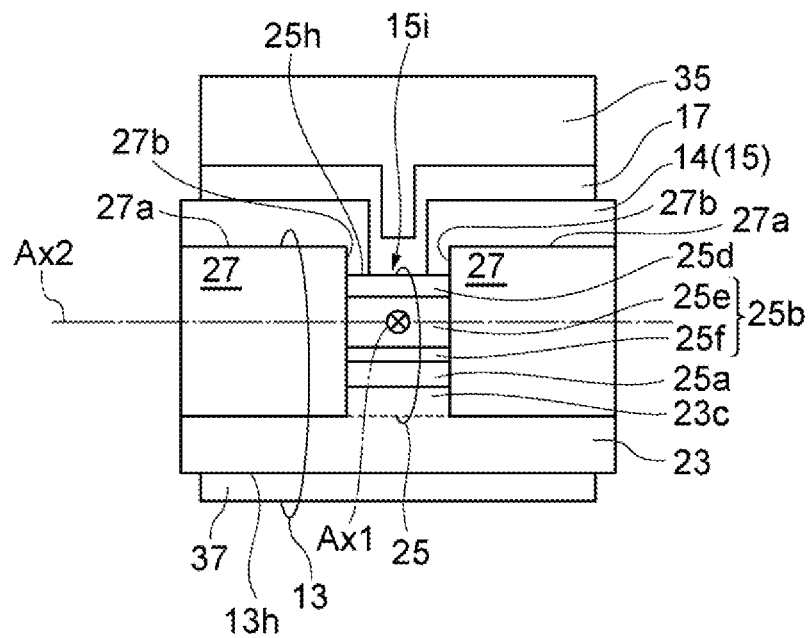

FIG. 3A is a cross-sectional view taken along line IIIa-IIIa line of FIG. 1, and FIG. 3B is a cross-sectional view taken along line IIIb-IIIb line of FIG. 1. FIG. 4A is a cross-sectional view taken along IVa-IVa line of FIG. 1, and FIG. 4B is a cross-sectional view taken along IVb-IVb line of FIG. 1. The structure of the separation area 15 will be described.

As illustrated in FIGS. 2A and 2B, the separation area 15 has a wall surface 15d on the semiconductor mesa 25 and the embedding area 27. The wall surface 15d is positioned in the boundary between the first area 13a and the second area 13b. In this embodiment, the wall surface 15d is defined by the upper face of the covering layer 14 which extends from the third area 13c to the first area 13a through the second area 13b, and runs over the base layer 16 over the first area 13a. As seen from FIG. 1, the wall surface 15d extends in a direction from one of a side face 13e and a side face 13f of the laser structure 13 to the other.

In this embodiment, the thick film electrode 35 has a side face separated from one side face 13e and the other side face 13f. The wall surface 15d terminates at an outer side of the side face of the thick film electrode 35.

As illustrated in FIGS. 1, 2A, and 2B, the wall surface 15d is provided not only in the semiconductor mesa 25, but also in the embedding area 27.

The separation area 15 has another wall surface 15c on the semiconductor mesa 25. The another wall surface 15c is positioned in the boundary between the second area 13b and the third area 13c. The another wall surface 15c extends over the semiconductor mesa 25 in the direction from one to the other of the side face 13e and the side face 13f as the pair of sides of the laser structure 13.

The covering layer 14 extends in the direction of the first axis Ax1 over the upper surface of the semiconductor mesa 25, specifically, the upper cladding layer 25e. In this embodiment, the another wall surface 15c is defined by the upper face of the covering layer 14 which extends from the second area 13b to the third area 13c, and runs over the contact layer 25d over the second area 13b and the third area 13c.

As illustrated in FIGS. 2A, 3B, and 4A, in the covering layer 14, a depression 15h is formed between the wall surface 15d and the another wall surface 15c over the semiconductor mesa 25 in the direction of the first axis Ax1 according to termination of the base layer 16 and termination of the contact layer 25d.

As illustrated in FIGS. 1, 2A, and 3B, the covering layer 14 extends in the direction of the second axis Ax2 over the upper face 25h of the semiconductor mesa 25, specifically, the upper cladding layer 25e. The covering layer 14 runs over the embedding areas 27 which terminate at the positions of both side faces of the semiconductor mesa 25, and extends over the embedding area 27. The covering layer 14 runs over the embedding areas 27 on both sides of the semiconductor mesa 25, thereby forming the depression 15h. As illustrated in FIGS. 1, 2B, and 3B, the running over causes the depression 15h to disappear, thus the depression 15h is not formed on the embedding area 27.

Example of Structure of Quantum Cascade Semiconductor Laser 11

Width W25 of the semiconductor mesa 25: 1 to 10 μm
Thickness H16 of the base layer 16: 100 to 500 nm
Width W16 of the base layer 16: 10 to 100 μm
Thickness of the covering layer 14 on the base layer 16: 100 to 500 nm
Thickness H25d of contact layer 25d: 50 to 300 nm
Distance between the end of contact layer 25d and the first end face E1F: 20 to 110 μm, or
25 to 75 μm for easy production
Thickness H14 of the covering layer 14 on the first area 13a: 100 to 500 nm
Height of the wall surface 15d: 100 to 500 nm
Thickness of the dielectric film 19 on the first end face E1F: 100 to 300 nm
Dielectric film 19: alumina, SiON, SiN, SiO2
Thickness of the metal reflecting film 21 on the first end face E1F: 10 to 100 nm
Metal reflecting film 21: Au
Thickness H15e of the first portion 15e: 200 to 600 nm
Thickness H15f of the second portion 15f: 100 to 500 nm
Thickness H15g of the third portion 15g: 200 to 600 nm Example of Structure of Separation Area 15

Width W15e of the first portion 15e: 10 to 100 μm
Width W15f of the second portion 15f: 5 to 50 μm
Width W15g of the third portion 15g: 10 to 100 μm
Length of the first area 13a: 10 to 100 μm
Length of the second area 13b: 5 to 50 μm
Thickness of the separation area 15 on the first area 13a: 200 to 600 nm
Thickness of the separation area 15 on the second area 13b: 100 to 500 nm Referring to FIG. 3A, on the first area 13a, the embedding area 27 covers the side surface of the semiconductor mesa 25, and the height of the embedding area 27 is higher than the upper surface 25h of the semiconductor mesa 25 not including the contact layer 25d. The base layer 16 runs over a wall surface in the boundary between the semiconductor mesa 25 and the embedding area 27, and extends in the direction of the second axis Ax2 over the semiconductor mesa 25 and the embedding area 27. The covering layer 14 is provided on the base layer 16, and the separation area 15 projects. The separation area 15 mounts the dielectric film 19 and the metal reflecting film 21. Addition of the base layer 16 compensates the height of the semiconductor mesa 25 not including the contact layer 25d by the thickness of the base layer 16.

Referring to FIG. 3B, on the second area 13b, the height of the embedding area 27 is higher than the upper surface 25h of the semiconductor mesa 25 not including the contact layer 25d. The separation area 15 over the second area 13b does not include the base layer 16, and is lower than the separation area 15 over the first area 13a. The difference between the heights of the separation area 15 over the second area 13b and the separation area 15 over the first area 13a is given with the thickness of the base layer 16, and deposition for the dielectric film 19 and the metal reflecting film 21 on the second area 13b and the third area 13c is not connected to the dielectric film 19 and the metal reflecting film 21 on the separation area 15 of the first area 13a. The dielectric film 19 and the metal reflecting film 21 on the first end face E1F is disconnected by the separation area 15 over the first area 13a.

Referring to FIG. 4A, on the third area 13c, the semiconductor mesa 25 includes the contact layer 25d in addition to the lower semiconductor area 23c, the core layer 25a, the grating layer 25f, and the upper cladding layer 25e. The height of the embedding area 27 is higher than the upper surface 25h of the semiconductor mesa 25 not including the contact layer 25d. The semiconductor mesa 25 is higher than the second area 13b by the thickness of the contact layer 25d. The covering layer 14 covers a terminal portion and an extended portion of the contact layer 25d, and insulates the semiconductor mesa 25 from the deposition for the dielectric film 19 and the metal reflecting film 21. When necessary, the metal layer 17 for an ohmic electrode is provided on the separation area 15. The third area 13c is positioned away from the first end face E1F by the first area 13a and the second area 13b, and is not connected to the dielectric film 19 and the metal reflecting film 21.

Referring to FIG. 4B, the metal layer 17 is connected to the semiconductor mesa 25 for power supply over the fourth area 13d. The separation area 15 has the stripe-shaped opening 15i for electrical connection. The metal layer 17 is in contact with the semiconductor mesa 25 through the stripe-shaped opening 15i. The covering layer 14 extends from an upper surface 27a of the embedding area 27 to a side surface 27b, and comes into contact with the upper surface of the semiconductor mesa 25, and terminates. The termination defines the stripe-shaped opening 15i. The semiconductor mesa 25 and the embedding area 27 are arranged in the direction of the second axis Ax2 crossing the first axis Ax1.

Referring to FIGS. 5 to 14, the steps in a method to produce a semiconductor laser will be described. In the subsequent description, when possible, in order to facilitate understanding, the reference symbols used in the description with reference to FIGS. 1 to 4 will be used.

Figure 5A:
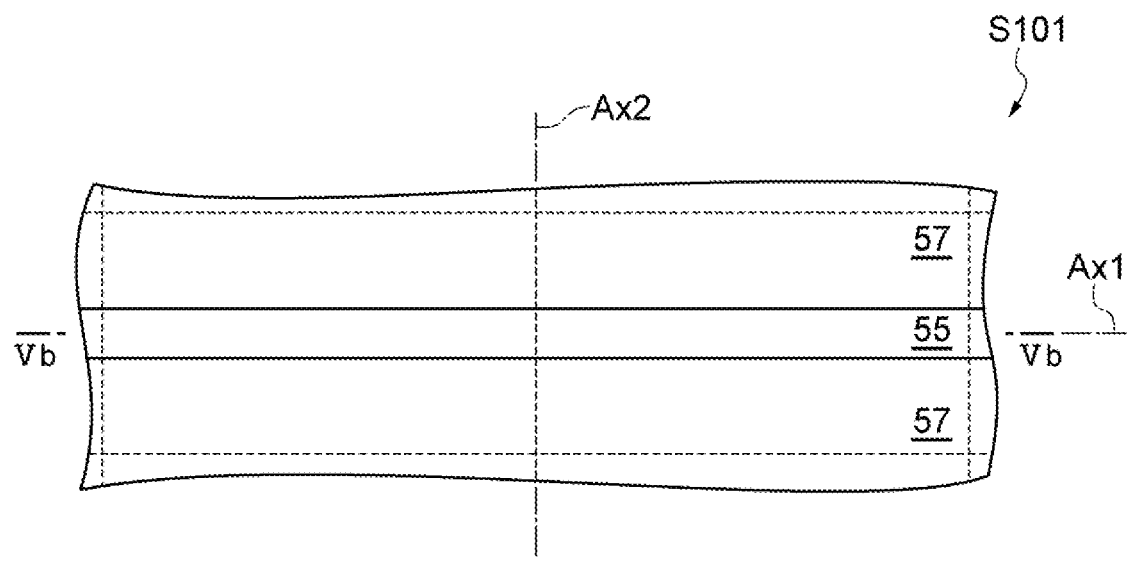
FIG. 5A is a plan view schematically illustrating the steps in a method of producing the quantum cascade semiconductor laser according to the embodiment.
Figure 5B:
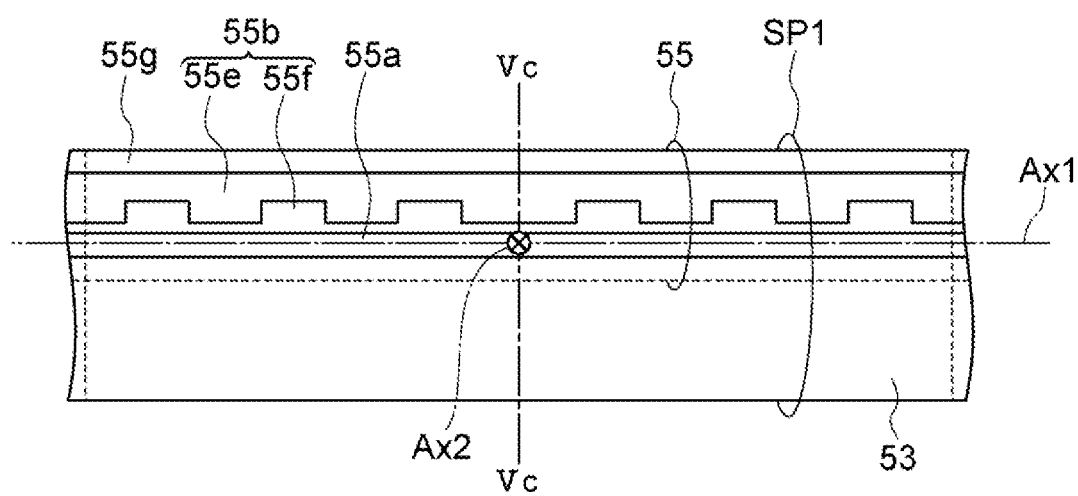
FIG. 5B illustrates a cross-section taken along line Vb-Vb illustrated in FIG. 5A.
Figure 5C:
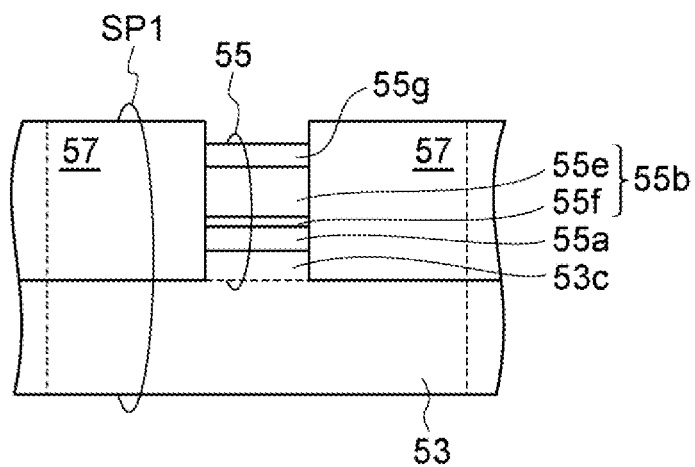
FIG. 5C illustrates a cross-section taken along line Vc-Vc illustrated in FIG. 5B.

Referring to FIG. 5A, 5B, and 5C, the step of preparing semiconductor products including the embedding area and the stripe-shaped mesa will be described. FIG. 5A is a plan view schematically illustrating the steps in a method of producing the quantum cascade semiconductor laser according to the embodiment. FIG. 5B illustrates a cross-section taken along line Vb-Vb illustrated in FIG. 5A. FIG. 5C illustrates a cross-section taken along line Vc-Vc illustrated in FIG. 5B. FIGS. 5A and 5B illustrate two adjacent device divisions with the boundary along the second axis Ax2 interposed therebetween. The drawn two device divisions are arranged in the direction of the first axis Ax1. The second axis Ax2 intersects perpendicularly to the first axis Ax1.

In step S101, a semiconductor product SP1 is produced. The production of the semiconductor product SP1 is performed as follows. A semiconductor film for forming the semiconductor mesa 25 is grown on the semiconductor substrate 53, and an epitaxial substrate is formed. A mask for defining the semiconductor mesa 25 is formed on an epitaxial substrate, and the epitaxial substrate is dry etched using the mask to form a stripe-shaped mesa 55. After the stripe-shaped mesa 55 is formed, an embedding area 57, in which the stripe-shaped mesa 55 is embedded, is grown by selective growth using the mask. The stripe-shaped mesa 55 includes multiple semiconductor films for the core layer 25a, the grating layer 25f, the upper cladding layer 25e, and the contact layer 25d (in the following description, in order to facilitate understanding, these semiconductor films are referred to as a semiconductor layer 55g for a core layer 55a, a grating layer 55f, a cladding layer 55e, and a contact layer), and a ridged portion 53c of the semiconductor substrate 53. After the selective growth, the mask is removed. The semiconductor product SP1 includes the semiconductor substrate 53, the stripe-shaped mesa 55 provided on the semiconductor substrate 53, and the embedding area 57 in which the stripe-shaped mesa 55 is embedded. In this embodiment, the upper surface of the stripe-shaped mesa 55 is comprised of an InGaAs layer, and the embedding area 57 is comprised of InP.

Figure 6A:
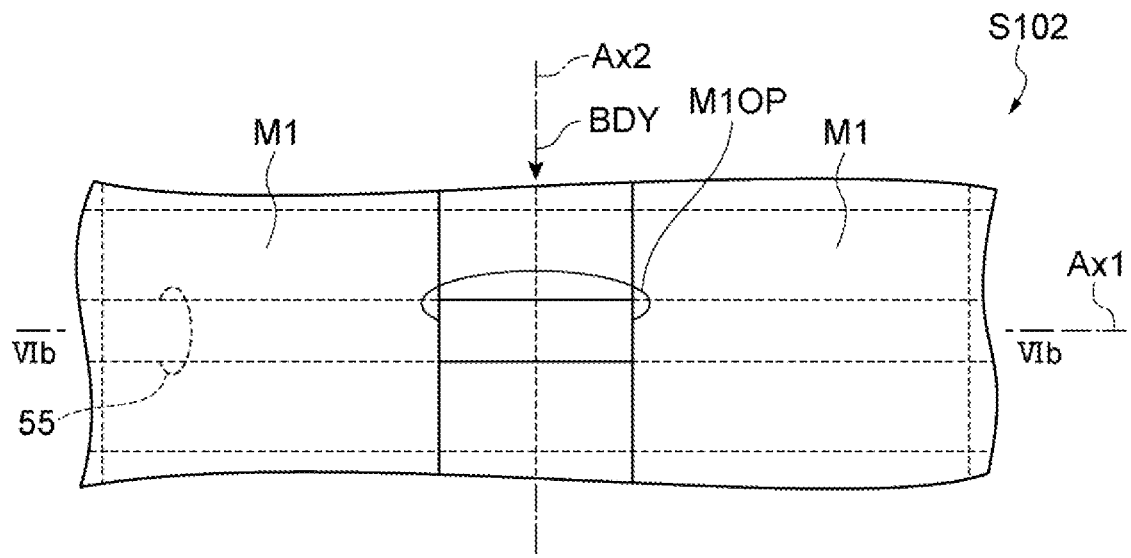
FIG. 6A is a plan view schematically illustrating the steps in the method of producing the quantum cascade semiconductor laser according to the embodiment.
Figure 6B:
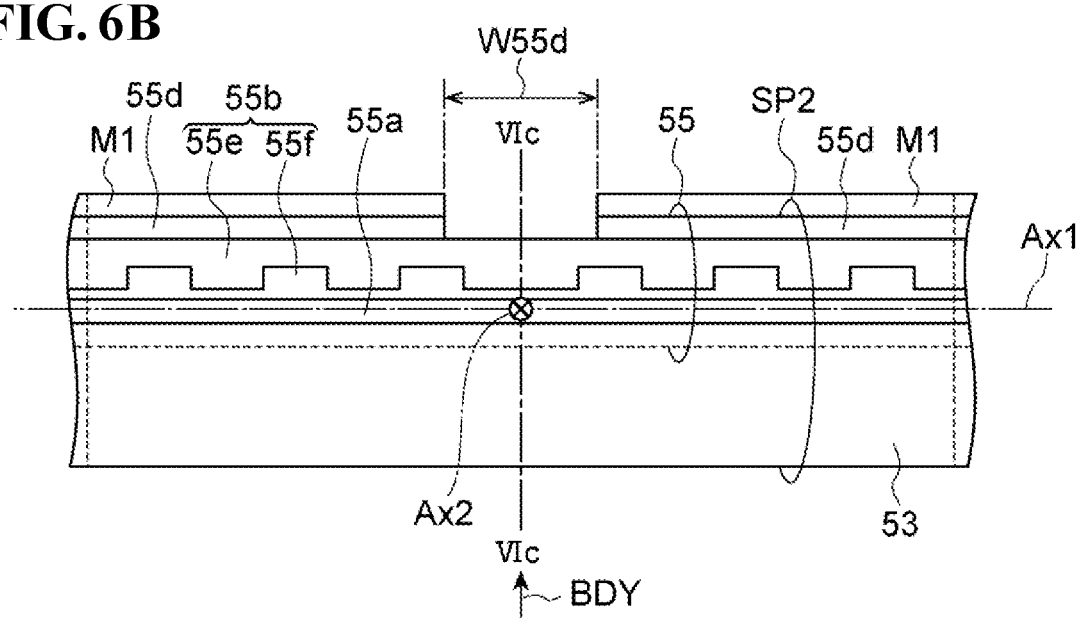
FIG. 6B illustrates a cross-section taken along line VIb-VIb illustrated in FIG. 6A.
Figure 6C:
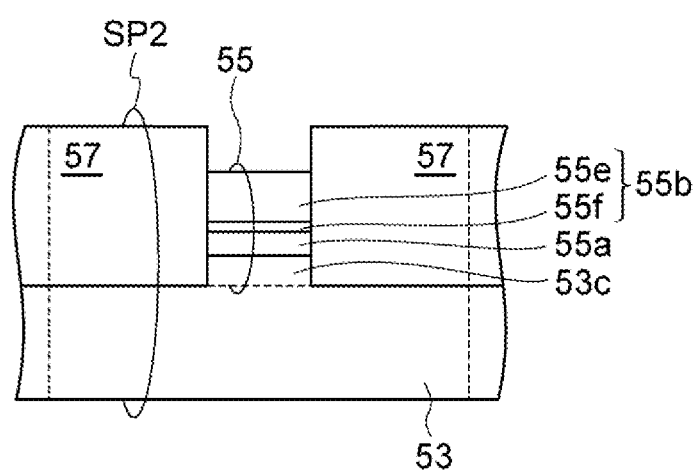
FIG. 6C illustrates a cross-section taken along line VIc-VIc illustrated in FIG. 6B.

Referring to FIG. 6A, 6B, and 6C, the step of partially removing the contact layer will be described. In step S102, part of the semiconductor layer for the contact layer 55d is removed by etching. A first mask M1 for the etching is formed on the semiconductor product SP1. The first mask M1 has an opening M1OP in an area including the boundary between adjacent device divisions. The opening M1OP extends in the direction of the second axis Ax2. In this embodiment, the opening M1OP of the first mask M1 has a stripe shape with a width of approximately 35 to 215 µm on a boundary BDY between device divisions. The first mask M1 includes an inorganic insulating film such as a SiN film. An InGaAs upper layer for the contact layer 25d is selectively removed by wet etching using the first mask M1, and the contact layer 55d is formed. The etchant for wet etching is BHF, for instance. After the wet etching, the first mask M1 is removed, and a substrate product SP2 is formed. The contact layer 55d has an opening which extends on the boundary between device divisions in the direction of the second axis Ax2, and an n-type InP upper cladding layer is exposed in the opening. An interval W55d of the ends of the contact layers 55d in adjacent device divisions is a width of 40 to 220 µm.

Figure 7A:
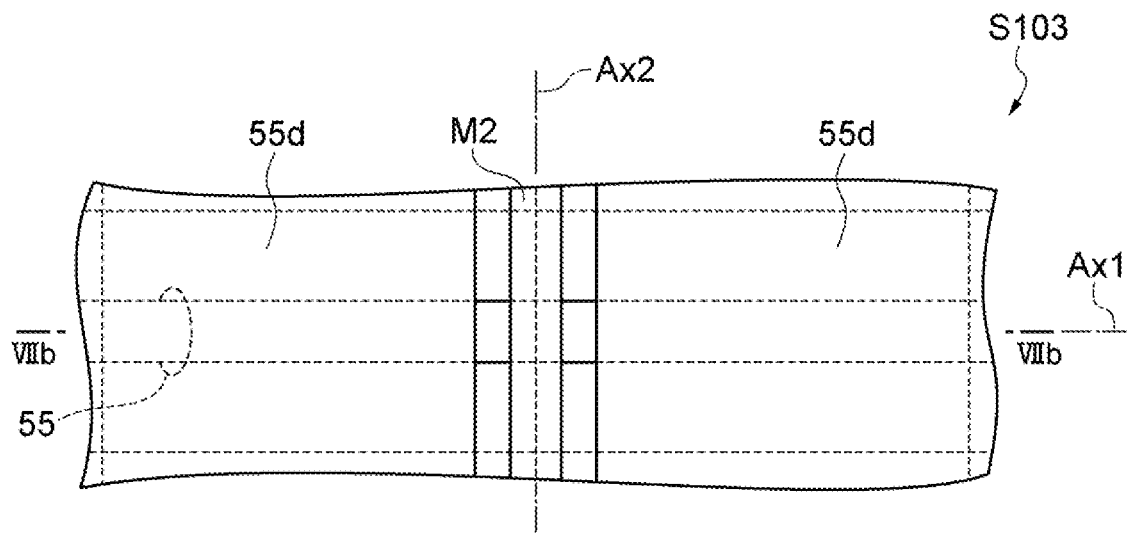
FIG. 7A is a plan view schematically illustrating the steps in the method of producing the quantum cascade semiconductor laser according to the embodiment.
Figure 7B:
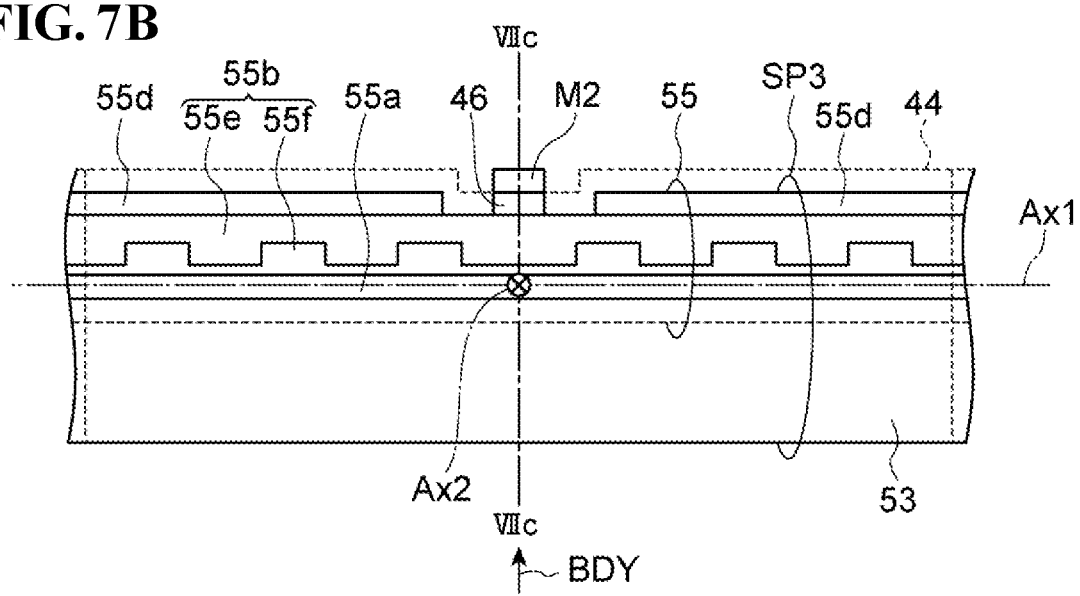
FIG. 7B illustrates a cross-section taken along line VIIb-VIIb illustrated in FIG. 7A.
Figure 7C:
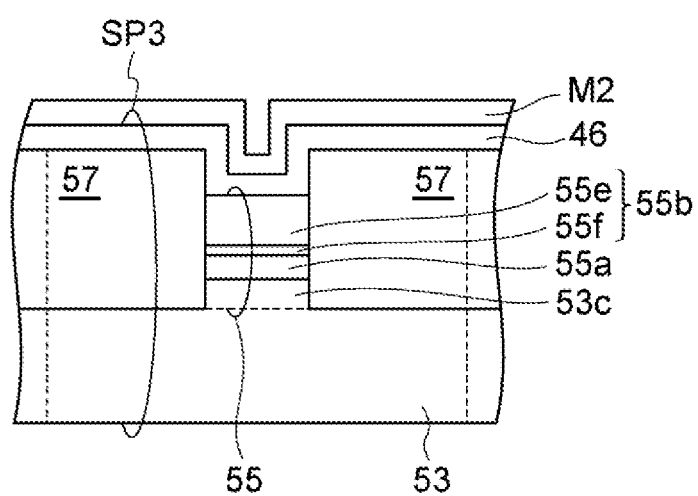
FIG. 7C illustrates a cross-section taken along line VIIc-VIIc illustrated in FIG. 7B.

Referring to FIG. 7A, 7B, and 7C, the step of forming an insulator structure for the base layer 16 will be described. In step S103, an insulator structure 46 is formed on the substrate product SP2. In this embodiment, an insulating film (an insulating film 44 illustrated by a dashed line) for the base layer 16 is deposited. The insulating film 44 includes, for instance, a silicon-based inorganic insulator, such as a SiN film, and has a thickness of 100 to 500 nm. The second mask M2 is formed on the insulating film 44 by photolithography. The second mask M2 has a stripe shape pattern extending in the direction of the second axis Ax2, for instance. The second mask M2 includes, for instance, a resist film. The insulating film 44 is etched using the second mask M2, and the insulator structure 46 for the base layer 16 of the separation area 15 is formed. The insulator structure 46 extends on the boundary BDY between device divisions. Specifically, the insulator structure 46 is separated from the end of the contact layer 55d, and has a width twice as much as the width of the base layer 16. The interval between the insulator structure 46 and the contact layer 55d is, for instance, 30 to 100 μm, and the width of the insulator structure 46 is, for instance, 20 to 200 μm. After the etching, the second mask M2 is removed, and a substrate product SP3 is formed.

Figure 8A:
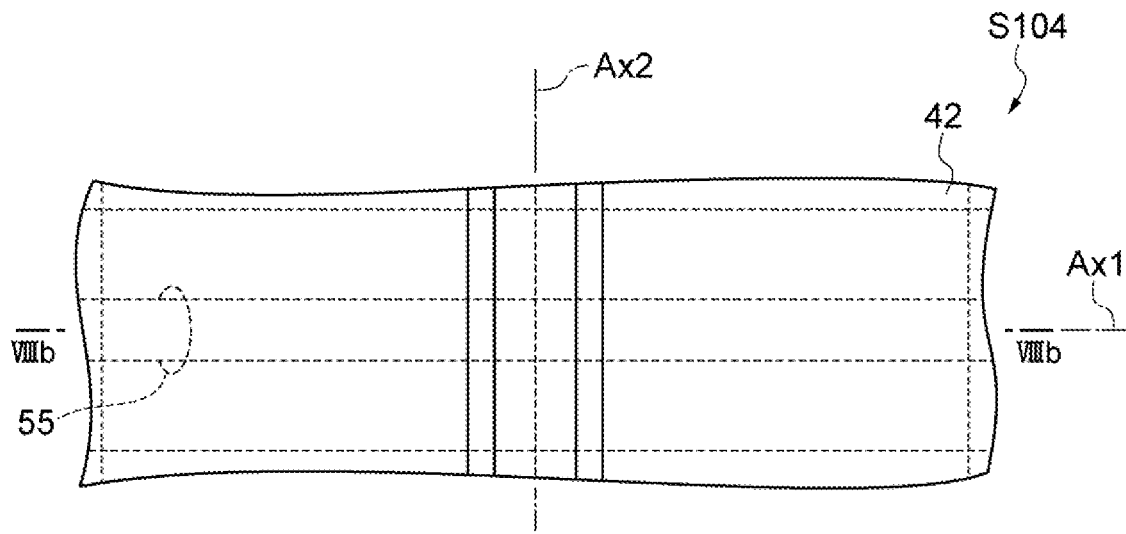
FIG. 8A is a plan view schematically illustrating the steps in the method of producing the quantum cascade semiconductor laser according to the embodiment.
Figure 8B:
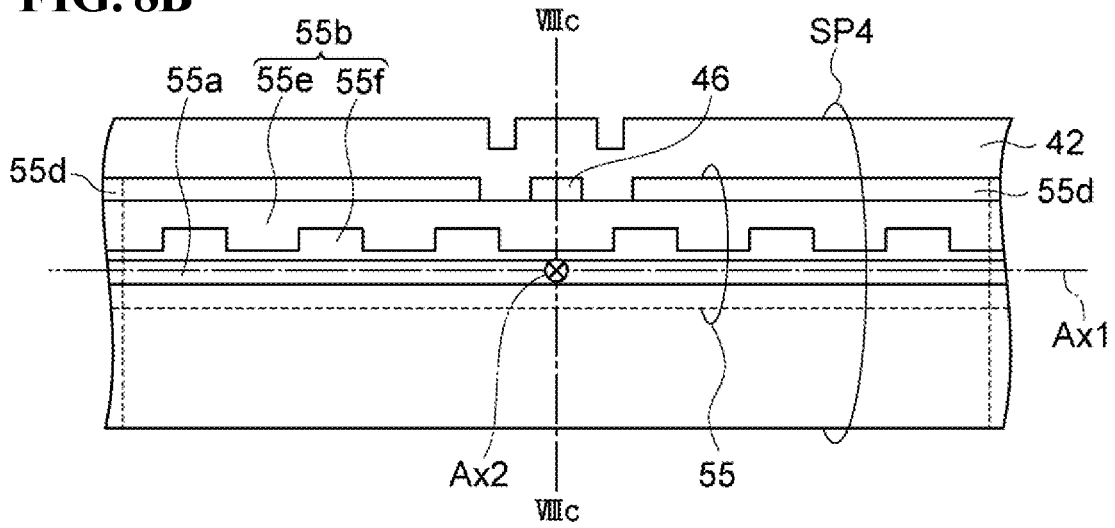
FIG. 8B illustrates a cross-section taken along line VIIIb-VIIIb illustrated in FIG. 8A.
Figure 8C:
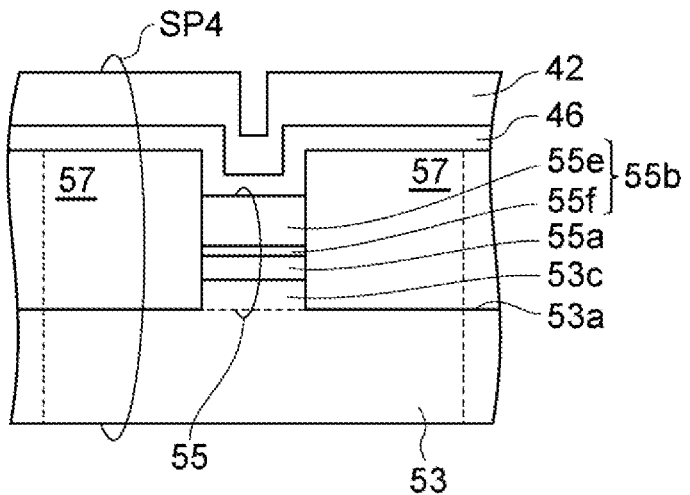
FIG. 8C illustrates a cross-section taken along line VIIIc-VIIIc illustrated in FIG. 8B.

Referring to FIG. 8A, 8B, and 8C, the step of depositing an insulating film 42 for the covering layer 14 on the substrate product SP3 so as to cover the insulator structure 46, the contact layer 55d, and the embedding area 57 will be described. In step S104, the insulating film 42 is deposited on the insulator structure 46. In this embodiment, the insulating film 42 covers the upper surface and the side surfaces of the embedding area 57, the upper surface and the ends of the contact layer 55d, the upper surface of the upper cladding layer, and the upper surface and the side surfaces of the insulator structure 46, and is formed in a shape which conform to the shape of these ground surfaces. The insulating film 42 includes, for instance, a silicon-based inorganic insulator, such as a SiON film, and has a thickness of 100 to 500 nm. A substrate product SP4 is formed by film formation of the insulating film 42.

Figure 9A:
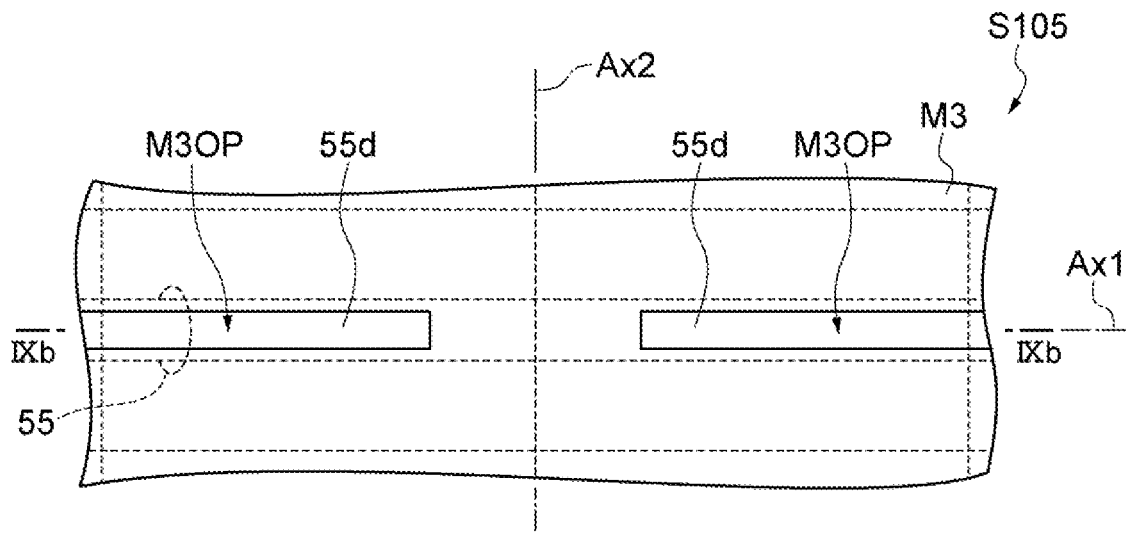
FIG. 9A is a plan view schematically illustrating the steps in the method of producing the quantum cascade semiconductor laser according to the embodiment.
Figure 9B:
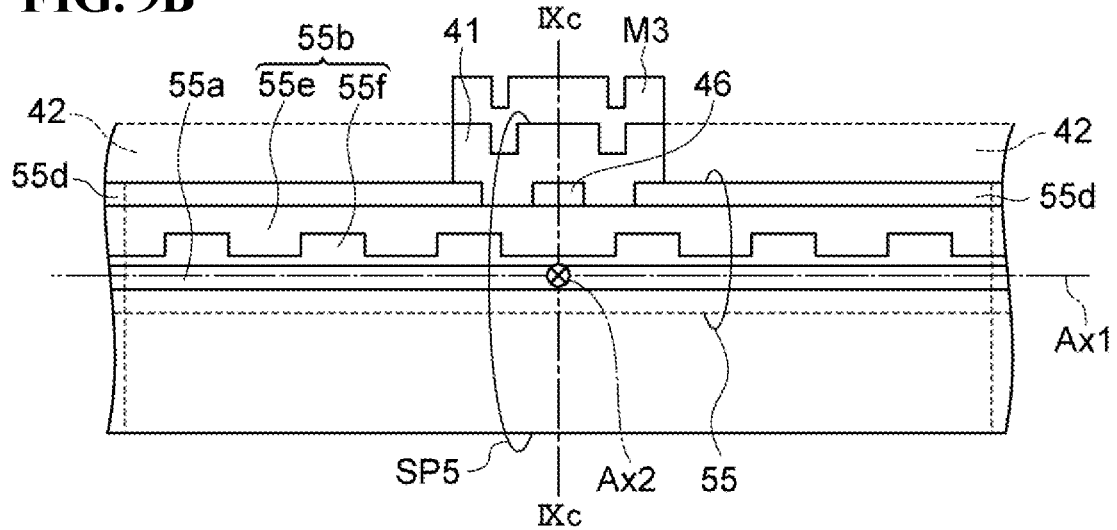
FIG. 9B illustrates a cross-section taken along line IXb-IXb illustrated in FIG. 9A.
Figure 9C:
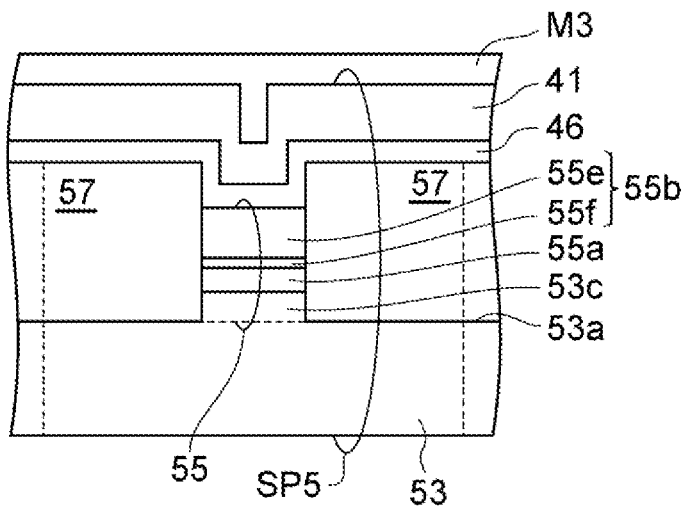
FIG. 9C illustrates a cross-section taken along line IXc-IXc illustrated in FIG. 9A.

Referring to FIG. 9A, 9B, and 9C, the step of performing pattern formation in the insulating film 42 will be described. In step S105, a third mask M3 is formed on the insulating film 42. In this embodiment, the third mask M3 has an opening M3OP which defines a contact opening, and a pattern which defines the opening M3OP. The opening M3OP is positioned on the contact layer 55d of the stripe-shaped mesa 55, and extends in the direction of the first axis Ax1. The third mask M3 includes, for instance, a resist film. The insulating film 44 is etched using the third mask M3, and a covering film 41 is formed. The etchant is BHF, for instance. After the etching, the third mask M3 is removed, and a substrate product SP5 including a separation structure 45 for the separation area 15 is formed.

Figure 10A:
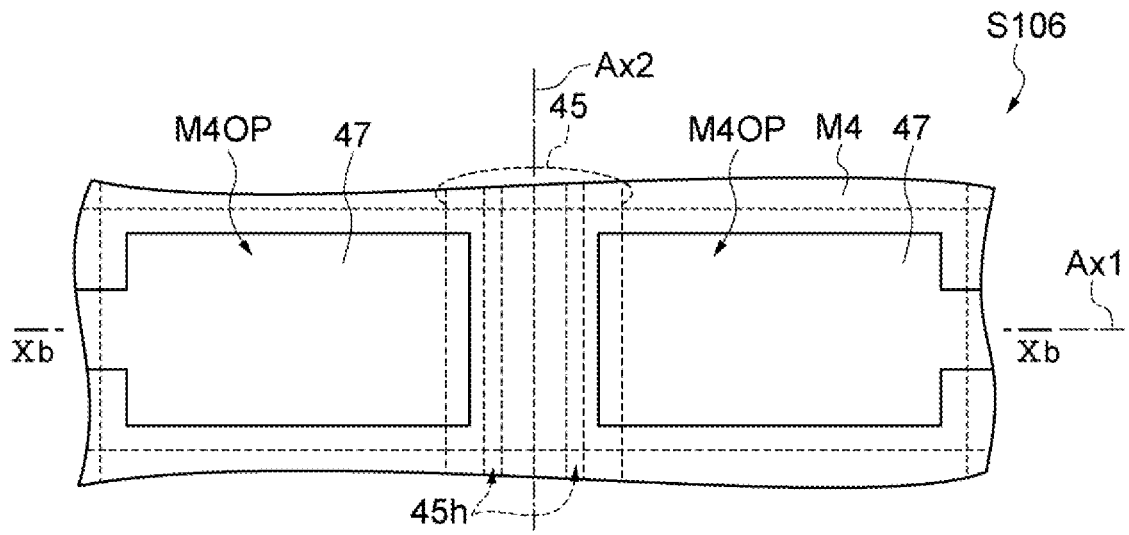
FIG. 10A is a plan view schematically illustrating the steps in the method of producing the quantum cascade semiconductor laser according to the embodiment.
Figure 10B:
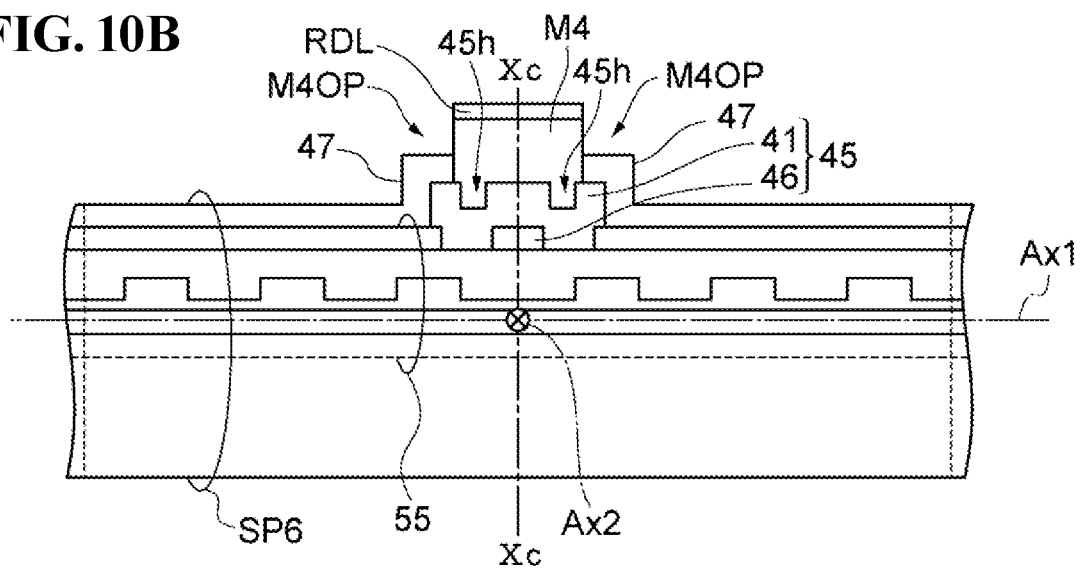
FIG. 10B illustrates a cross-section taken along line Xb-Xb illustrated in FIG. 10A.
Figure 10C:
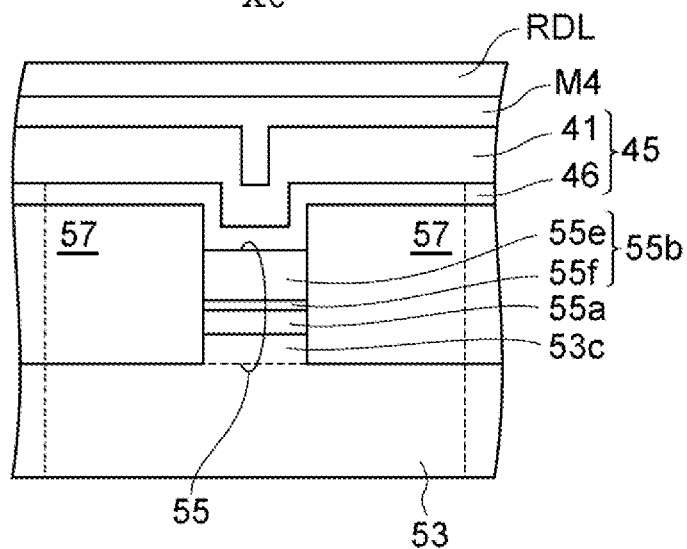
FIG. 10C illustrates a cross-section taken along line Xc-Xc illustrated in FIG. 10B.

Referring to FIG. 10A, 10B, and 10C, the step of forming a metal layer 47 for an ohmic electrode will be described. In step S106, the metal layer 47 is formed on the substrate product SP5. A fourth mask M4 for liftoff is formed on the substrate product SP5. The fourth mask M4 has an opening M4OP along the stripe-shaped mesa 55, and a pattern which defines the opening M4OP. The pattern covers a depression 45h. A metal film for the metal layer 47 is deposited on the pattern and opening of the fourth mask M4. The metal film includes a vapor-deposited film comprised of Ti/Pt/Au, for instance. When the fourth mask M4 is removed after the deposition, deposition RDL disappears, and a substrate product SP6 with the remaining metal layer 47 is obtained. The metal layer 47 is bonded to the contact layer 55d, and is in contact with an insulator covering film 41. When necessary for subsequent plating, the metal layer 47 may include an ohmic electrode and a power feed line.

Figure 11A:
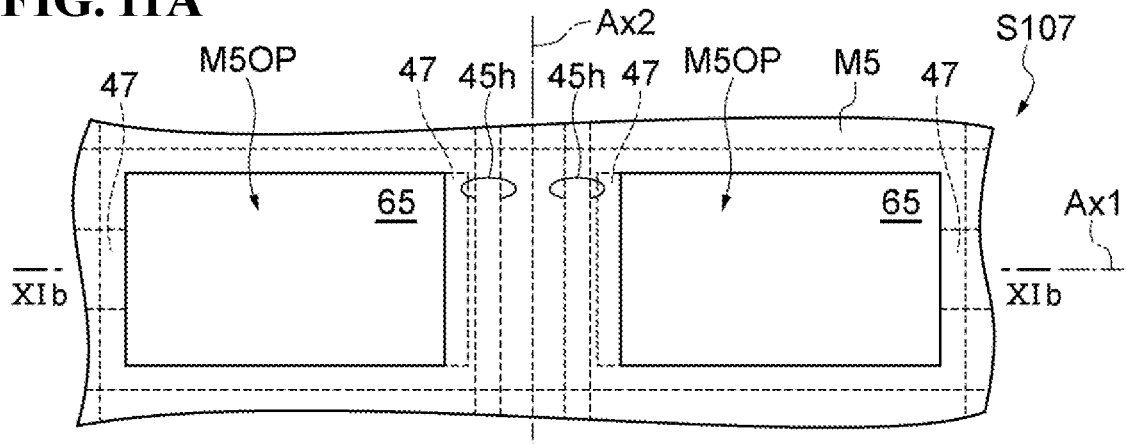
FIG. 11A is a plan view schematically illustrating the steps in the method of producing the quantum cascade semiconductor laser according to the embodiment.
Figure 11B:
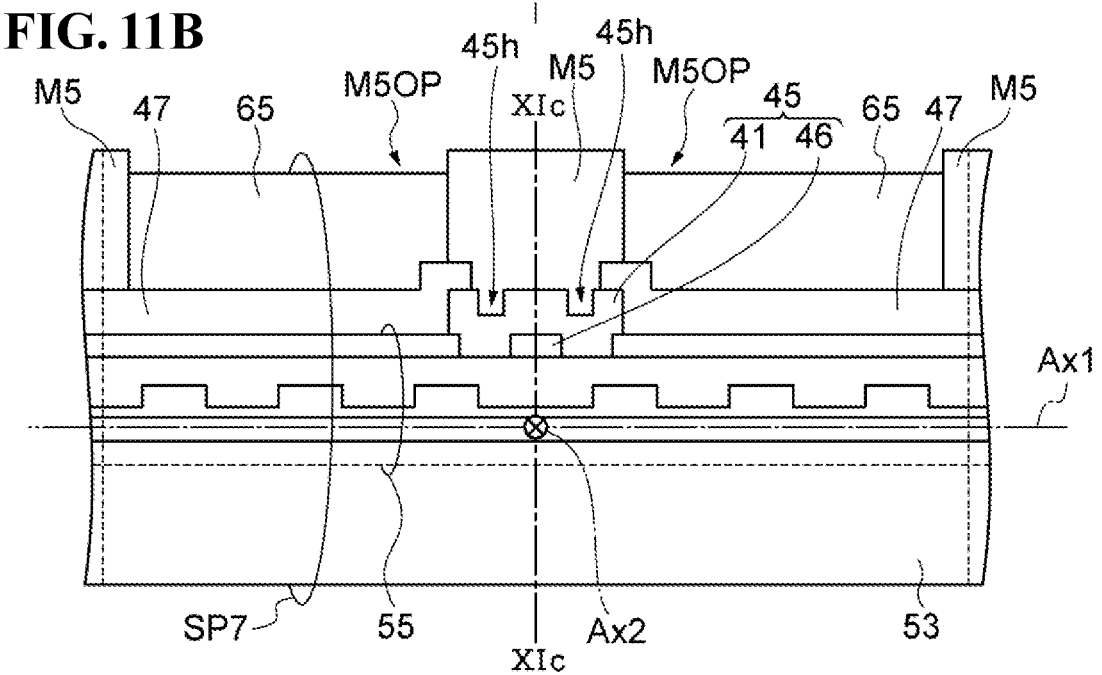
FIG. 11B illustrates the section taken along the XIb-XIb line illustrated in FIG. 11A.
Figure 11C:
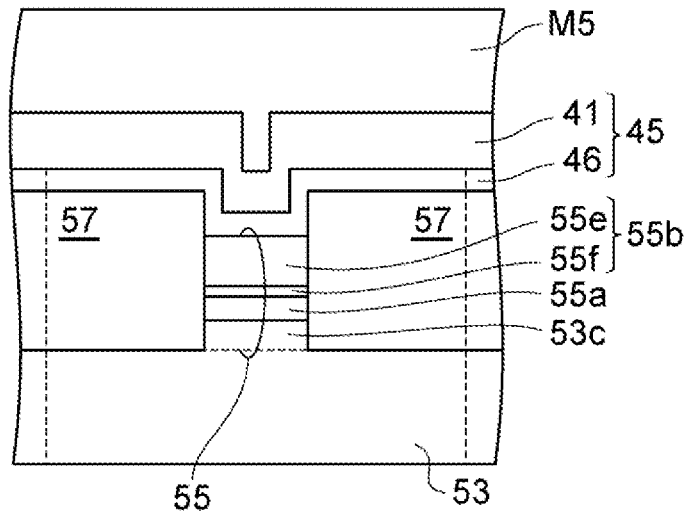

Referring to FIG. 11A, 11B, and 11C, the step of forming the thick film electrode 35 will be described. In step S107, a metal thick film 65 is formed by a plating method. A fifth mask M5 is formed on the separation structure 45 and the metal layer 47. The fifth mask M5 defines an opening M5OP on the metal layer 47, and has a pattern which covers the depression 45h. The opening M5OP is provided on the metal layer 47. After the fifth mask M5 is formed, metal for the thick film electrode 35 is deposited by a plating method. In the plating method, plating deposits are formed on the metal layer 47 in the opening M5OP of the fifth mask M5. When the fifth mask M5 is removed after energization for plating, a substrate product SP7 including the metal thick film 65 for the thick film electrode 35 is formed.

Figure 12A:
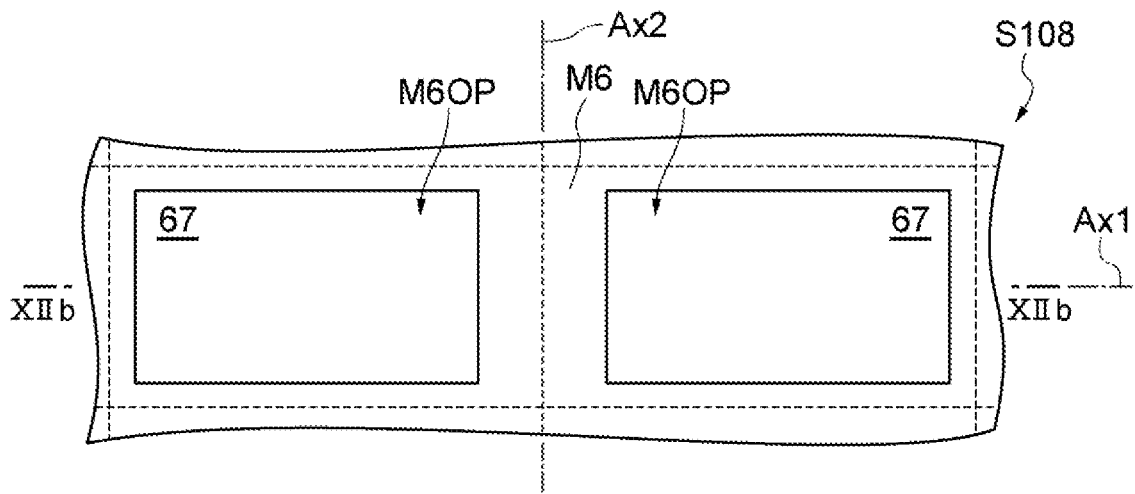
FIG. 12A is a back view schematically illustrating the steps in the method of producing the quantum cascade semiconductor laser according to the embodiment.
Figure 12B:
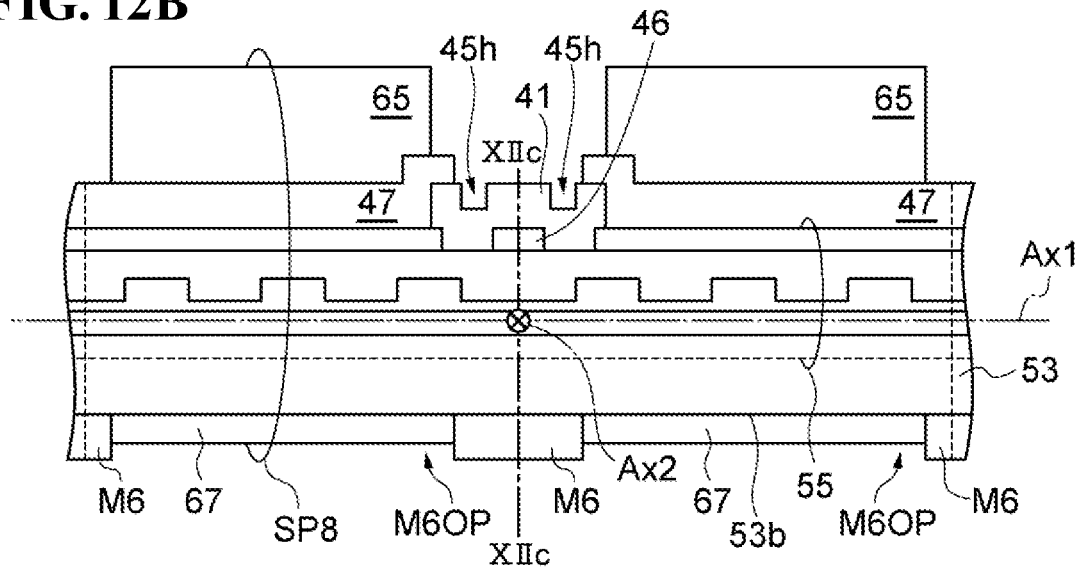
FIG. 12B illustrates a cross-section taken along line XIIb-XIIb illustrated in FIG. 12B.
Figure 12C:
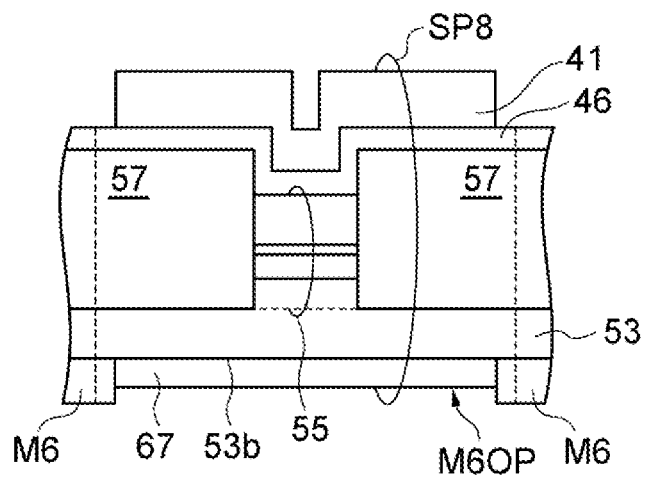
FIG. 12C illustrates a cross-section taken along line XIIc-XIIc illustrated in FIG. 12C.
Figure 13A:
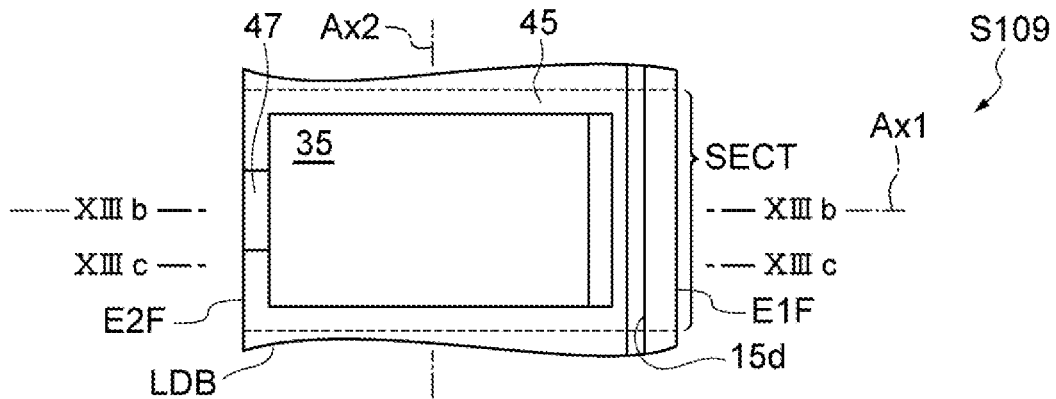
FIG. 13A is a plan view illustrating the main steps in the method of producing the quantum cascade semiconductor laser according to the embodiment.
Figure 13B:
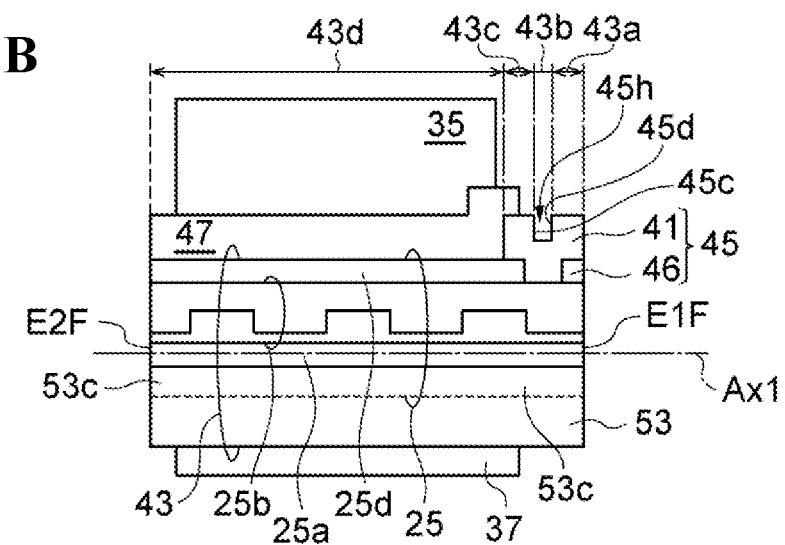
Figure 13C:
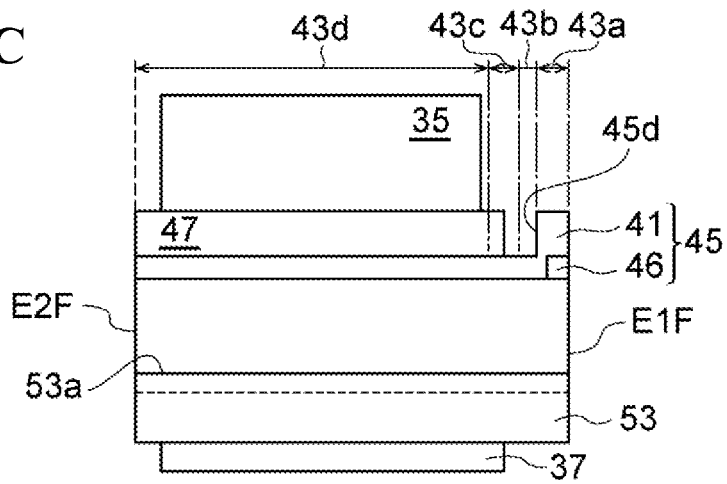
FIG. 13C illustrates a cross-section taken along line XIIIc-XIIIc illustrated in FIG. 13A.
Figure 13D:
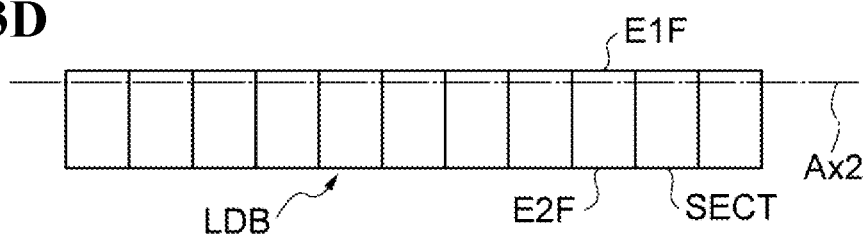
FIG. 13D is a plan view illustrating a laser bar.

Referring to FIG. 12A, 12B, and 12C, the step of forming a back surface electrode will be described. In step S108, a back surface metal layer 67 for a back surface electrode is formed. A sixth mask M6 for liftoff, for instance, a resist mask is formed on a back surface 53b of the semiconductor substrate 53. The sixth mask M6 has an opening M6OP on the back surface 53b of the semiconductor substrate 53. After the sixth mask M6 is formed, a vapor-deposited film comprised of AuGeNi/Au/Ti/Au is formed, and the sixth mask M6 and deposition on the sixth mask M6 are removed by liftoff. Thus the back surface metal layer 67 is formed, and a substrate product SP8 is produced. AuGeNi/Au/Ti/Au of the back surface metal layer 67 is bonded to the back surface 53b of the semiconductor substrate 53.

Referring to FIG. 13A, 13B, 13C and 13D, the step of producing a laser bar will be described. In step S109, a laser bar LDB is formed. The laser bar LDB is produced by separating the substrate product SP7 along a cleavage line. The laser bar LDB is formed by the separation. The laser bar LDB has the first end face E1F and the second end face E2F in the quantum cascade semiconductor laser 11. In this embodiment, each of the first end face E1F and the second end face E2F includes a cleavage line.

The laser bar LDB includes arrangement of a device division SECT for a quantum cascade semiconductor laser 11a. The device division SECT is arranged in the direction of the second axis Ax2. As seen from the quantum cascade laser 1 illustrated in FIG. 1, the device division SECT includes a laser structure 43, the separation structure 45, the metal layer 47, the thick film electrode 35, and the back surface metal layer 37. The laser structure 43 and the separation structure 45 extends across an array-shaped device division SECT. The laser structure 43 has a first area 43a, a second area 43b, a third area 43c, and a fourth area 43d. The first area 43a, the second area 43b, the third area 43c, and the fourth area 43d, are sequentially disposed in the direction of the first axis Ax1. The first area 43a includes the first end face E1F, and the fourth area 43d includes the second end face E2F. The separation structure 45 has a wall surface 45d positioned in the boundary between the first area 43a and the second area 43b. The wall surface 45d continuously extends over the device division SECT in the direction of the second axis Ax2. The separation structure 45 is provided over the first area 43a, the second area 43b, and the third area 43c of the laser structure 43. The metal layer 47 is provided over the third area 43c and the fourth area 43d of the laser structure 43, and is in contact with Epi surface of the fourth area 43d of the laser structure 43. The laser structure 43 includes the semiconductor substrate 53 and the stripe-shaped mesa 55, and the semiconductor mesa 25 extending in the direction of the first axis Ax1 is mounted on a major surface 53a of the semiconductor substrate 53 in a stripe shape. The semiconductor mesa 25 includes the core layer 25a and the contact layer 25d, and specifically includes the upper semiconductor layer 25b, and the ridged portion 53c. In this embodiment, the laser structure 43 further includes the embedding area 57 in which the semiconductor mesa 25 is embedded.

Referring to FIG. 14A, 14B, 14C, and 14D, the step of producing a reflector at the end face of the laser bar will be described. In step S110, the dielectric film 49 and the metal reflecting film 51 are sequentially formed on the first end face E1F of a prepared laser bar LDB.

As illustrated in FIGS. 14A and 14B, the dielectric film 49 is formed on the first end face E1F of the laser bar LDB. In this embodiment, the dielectric film 49 is deposited using a deposition apparatus D1EP. The deposition apparatus D1EP supplies raw material flux F1 to the first end face E1F of the laser bar LDB, and causes a film for the dielectric film 49 to be deposited on the first end face E1F. The raw material flux F1 which has deviated from the first end face E1F is ejected along the upper surface and the lower surface of the laser bar LDB, then deposition due to the raw material flux F1 is deposited on the separation structure 45 and the metal layer 17 over the upper surface of the laser structure 43, and is formed on the back surface metal layer 37 on the lower surface. The deposition, which extends from the dielectric film 49 on the first end face E1F, terminates at the edge of the wall surface 45d of the separation structure 45.

After the dielectric film 49 is formed, as illustrated in FIGS. 14C and 14D, the metal reflecting film 51 is formed on the first end face E1F of the laser bar LDB. In this embodiment, the metal reflecting film 51 is deposited using a deposition apparatus D2EP. The deposition apparatus D2EP supplies raw material flux F2 to the first end face E1F of the laser bar LDB, and causes a film for the metal reflecting film 51 to be deposited on the first end face E1F. The raw material flux F2 which has deviated from the first end face E1F is ejected along the upper surface and the lower surface of the laser bar LDB, then deposition due to the raw material flux F2 is deposited on the separation structure 45 and the metal layer 47 over the upper surface of the laser structure 43, and is formed so as to reach the back surface metal layer 37 on the lower surface. The deposition, which extends to the metal reflecting film 51 on the first end face E1F, terminates at the edge of the wall surface 45d of the separation structure 45.

In the step after the dielectric film 49 and the metal reflecting film 51 are formed on the first end face E1F of the laser bar LDB, a chip-shaped quantum cascade semiconductor laser 11 is formed by separation of the laser bar LDB. The quantum cascade semiconductor laser 11 is completed by these steps.

Although the principle of the present disclosure has been illustrated and described in a preferred embodiment, it is recognized by those skilled in the art that the present disclosure may be changed in arrangement and in detail without departing from such a principle. The present disclosure is not limited to the specific configuration disclosed in this embodiment. We therefore claim all modifications and variations coming within the spirit and scope of the following claims.

What is claimed is:

1. A quantum cascade semiconductor laser comprising:
a laser structure having a first area including an end face, a second area, and a third area;
a metal layer provided on a major surface of the laser structure in the third area;
a separation area provided on the major surface of the laser structure; and
a reflector provided on the laser structure,
wherein the reflector includes a dielectric film and a metal reflecting film provided on the end face and the separation area,
the first area, the second area, and the third area of the laser structure are sequentially disposed in a direction of a first axis,
the separation area has a first portion, a second portion, and a third portion respectively provided on major surfaces of the first area, the second area, and the third area of the laser structure,
the metal layer has an edge separated from the end face in the third area,
the laser structure includes a semiconductor mesa including a contact layer and a core layer, an embedding area in which the semiconductor mesa is embedded, and a substrate on which the embedding area and the semiconductor mesa are mounted,
the contact layer has an edge separated from the end face in the third area,
the first portion of the separation area projects more than the second portion of the separation area over the semiconductor mesa, and
the third portion of the separation area projects more than the second portion of the separation area over the semiconductor mesa.

2. The quantum cascade semiconductor laser according to claim 1,
wherein the laser structure further includes a fourth area,
the first area, the second area, the third area, and the fourth area are sequentially disposed in the direction of the first axis,
the separation area includes a covering layer provided on the major surface of the laser structure,
the covering layer includes a first insulating layer,
the covering layer has a stripe-shaped opening positioned over the semiconductor mesa in the major surface of the laser structure in the fourth area, and
the metal layer is in contact with the fourth area through the stripe-shaped opening.

3. The quantum cascade semiconductor laser according to claim 2,
wherein the separation area includes a base layer which extends in a direction of a second axis crossing the direction of the first axis, and
the covering layer is provided on the base layer.

4. The quantum cascade semiconductor laser according to claim 3,
wherein the base layer further includes a second insulating layer which extends over the first area in the direction of the second axis crossing the direction of the first axis,
the second insulating layer has an upper surface and a side surface which are in contact with a first inorganic insulating layer,
the second insulating layer has an end face which is in contact with a dielectric film,
the second insulating layer has a bottom surface which is in contact with the semiconductor mesa, and
the first insulating layer has an end face and an upper surface which are in contact with the dielectric film in the first portion of the separation area.

5. The quantum cascade semiconductor laser according to claim 3,
wherein the base layer includes a material different from a material of the first insulating layer.

6. The quantum cascade semiconductor laser according to claim 3,
wherein the base layer includes a same material as a material of the first insulating layer.

* * * * *